United States Patent [19]
Kojima et al.

[11] Patent Number: 5,376,823
[45] Date of Patent: Dec. 27, 1994

[54] LATERAL BIPOLAR TRANSISTOR AND METHOD OF PRODUCING THE SAME

[75] Inventors: Manabu Kojima; Naoshi Higaki, both of Kawasaki, Japan

[73] Assignee: Fujitsu Limited, Kawasaki, Japan

[21] Appl. No.: 127,119

[22] Filed: Sep. 27, 1993

Related U.S. Application Data

[63] Continuation of Ser. No. 850,135, Mar. 12, 1992, abandoned.

[30] Foreign Application Priority Data

| Mar. 15, 1991 | [JP] | Japan | 3-049987 |
| Mar. 18, 1991 | [JP] | Japan | 3-051941 |
| Mar. 20, 1991 | [JP] | Japan | 3-057424 |
| Jul. 10, 1991 | [JP] | Japan | 3-168559 |

[51] Int. Cl.$^5$ .............................. H01L 29/72
[52] U.S. Cl. ........................ 257/578; 257/584
[58] Field of Search ............... 357/34; 257/578, 584, 257/593, 592

[56] References Cited

U.S. PATENT DOCUMENTS

| 4,658,282 | 4/1987 | Matzen, Jr. | 357/34 |
| 4,710,241 | 12/1987 | Komatsu | 437/162 |
| 5,028,973 | 7/1991 | Bajor | 357/34 |

FOREIGN PATENT DOCUMENTS

| 57-178363 | 11/1982 | Japan . |
| 3-8341 | 1/1991 | Japan . |

OTHER PUBLICATIONS

Sturm et al., "A lateral silicon-on-insulator bipolar transistor with a self-aligned base contact", *IEEE Electron Device Letters*, vol. EDL-8, No. 3, pp. 104–106, Mar. 1987.

Tamba et al., "A Novel CMOS-Compatible Lateral Bipolar Transistor for High-Speed BICMOS LSI", IEDM 90, 395–398, 1990.

*Primary Examiner*—Andrew J. James
*Assistant Examiner*—Stephen D. Meier
*Attorney, Agent, or Firm*—Staas & Halsey

[57] ABSTRACT

A lateral bipolar transistor includes an insulating substrate, a single crystal semiconductor layer having a first conductivity, a mask layer which has a substantially vertical side surface and which is in contact with the single crystal semiconductor layer, and an insulating sidewall formed along the side surface of the mask layer. A base region is located under the insulating sidewall and formed in the single crystal semiconductor layer. The base region has a second conductivity opposite to the first conductivity and contains an impurity implanted by an ion implantation process. The single crystal semiconductor layer has an underlying portion on which the mask layer and the insulating sidewall are formed. An emitter region is formed in a first portion of the single crystal semiconductor layer other than the underlying portion. A collector region is formed in a second portion of the single crystal semiconductor layer other than the underlying portion.

16 Claims, 26 Drawing Sheets

1ST ION IMPLANTATION

2ND ION IMPLANTATION

THERMAL DIFFUSION

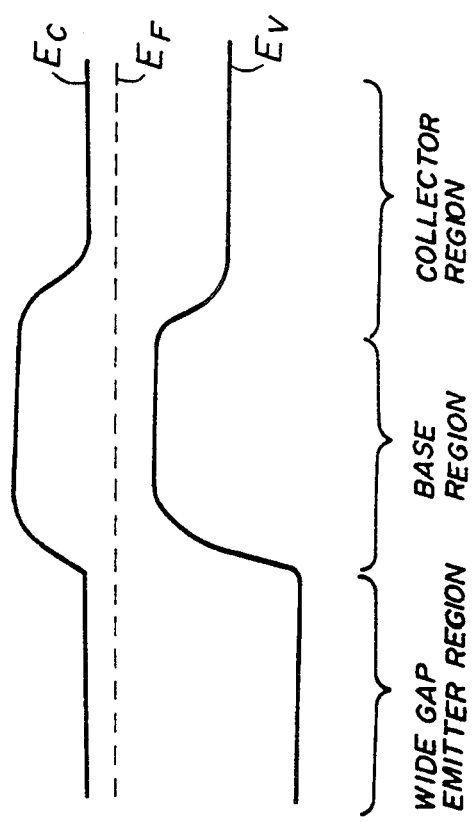

LATERAL BIPOLAR TRANSISTOR AND METHOD OF PRODUCING THE SAME

This application is a continuation of U.S. patent application Ser. No. 07/850,135, filed Mar. 12, 1992, now abandoned.

BACKGROUND OF THE INVENTION (1) Field of the Invention

The present invention generally relates to semiconductor devices, and more particularly to a semiconductor device in which a bipolar transistor is formed on an insulating substrate having an SOI (Silicon-On-Insulator) structure. Further, the present invention is concerned with a method of producing such a semiconductor device.

(2) Background of the Invention

An insulating substrate is known in which two silicon substrates are bonded through an oxide film. There is also known a SIMOX substrate in which oxide ions are introduced from a surface of a silicon substrate and an oxide area having a predetermined depth from the surface is formed. These SOI substrates are suitable for producing low-parasitic capacitance and high-speed semiconductor elements in which semiconductor elements are formed in a surface area thereof and isolated from a peripheral area by a dielectric layer. Recent technical advance makes it possible to produce a submicron silicon active layer formed on an oxide film of the SOI substrate. By using such an SOI substrate, it is possible to produce a MOS (Metal Oxide Semiconductor) transistor which has a high transconductance (gm) and a suppressed short channel effect. However, in order to improve a load driving ability, it is desired that a bipolar transistor be produced. A conventional bipolar transistor has a vertical structure in which current is vertically passed. At present, it is difficult to produce a vertical transistor using the SOI substrate. More specifically, a large number of production steps is needed, and it is particularly difficult to form a collector buried layer. For these reasons, there has been considerable activity in the development of producing a bipolar transistor having a lateral structure.

FIG. 1 shows a conventional lateral bipolar transistor having the SOI structure. A semiconductor layer 50 is formed on a semiconductor substrate 51 made of oxide silicon ($SiO_2$). The semiconductor layer 50 has a p-type impurity concentration suitable for forming a p-type base region 52. A portion of the semiconductor layer 50 other than an element formation area thereof is oxidized, so that an element isolation region 55 is formed. The element formation region surrounded by the element isolation region 55 is selectively doped with an n-type impurity, so that an n-type emitter region 53 and an n-type collector region 54 are formed. An insulating layer 57 made of, for example, $SiO_2$, is formed on the semiconductor layer 50, and openings are formed at predetermined positions of the semiconductor layer 50. Via these openings, an n+-type polysilicon electrodes 62 and 63 which are in contact with predetermined semiconductor regions are formed. Similarly, an insulating film 58 made of, for example, $SiO_2$, is formed. After an opening positioned above the p-type opening is formed in the insulating film 58, a p+-type polysilicon electrode 61 is formed.

In the structure shown in FIG. 1, the polysilicon electrode 61 forms a base lead electrode, the polysilicon electrode 62 forms an emitter lead electrode, and the polysilicon electrode 63 forms a collector lead electrode. These polysilicon electrodes 61, 62 and 63 are isolated from each other by insulating layers 57, 58 and 59 respectively made of an insulating material, such as oxide silicon. Opening are formed in predetermined areas of the insulating layer 59. Via the openings, a base electrode 64, an emitter electrode 65 and a collector electrode 66 are formed, as shown in FIG. 1. The base electrode 64 is in contact with the polysilicon base lead electrode 61, and the emitter electrode 65 is in contact with the polysilicon emitter lead electrode 62. The collector electrode 66 is in contact with the polysilicon collector lead electrode 63.

The emitter region 53 and the collector region 54 are formed by diffusing the impurity ions from the surface of the p-type layer 50. In this case, the distance between the edge of the emitter region 53 and the edge of the collector region 54 increases as the distance from the surfaces of the regions increases. That is, the width of the base region 52 in the lateral direction (base width) increases as the depth increases.

The p-type base region 52 must have a lateral length equal to or greater than a predetermined length in the lateral direction. For example, the lateral width of the base region 52 is limited to 0.1–0.15 $\mu$m. However, it is desired that the base region has a narrow and constant width in the depth direction thereof.

SUMMARY OF THE INVENTION

It is a general object of the present invention to provide a lateral bipolar transistor in which the above disadvantages are eliminated.

A more specific object of the present invention to provide a lateral bipolar transistor having a narrow and constant base width in the depth direction thereof.

The above objects of the present invention are achieved by a lateral bipolar transistor comprising: an insulating substrate; a single crystal semiconductor layer having a first conductivity; a mask layer which has a substantially vertical side surface and which is in contact with the single crystal semiconductor layer; an insulating sidewall formed along the side surface of the mask layer; a base region located under the insulating sidewall and formed in the single crystal semiconductor layer, the base region having a second conductivity opposite to the first conductivity and containing an impurity implanted by an ion implantation process, the single crystal semiconductor layer having an underlying portion on which the mask layer and the insulating sidewall are formed; an emitter region formed in a first portion of the single crystal semiconductor layer other than the underlying portion; and a collector region formed in a second portion of the single crystal semiconductor layer other than the underlying portion.

Another object of the present invention is to provide a method of producing the above lateral bipolar transistor.

This object of the present invention is achieved by a method of producing a lateral bipolar transistor, comprising the steps of: (a) forming a mask layer on a single crystal semiconductor layer which is formed on an insulating substrate and which has a first conductivity; (b) implanting, into the single crystal semiconductor layer, impurity ions having a second conductivity opposite to the first conductivity, so that a first region having a second conductivity is formed in the single crystal semiconductor layer; (c) forming an insulating sidewall along a substantially vertical side surface of the mask layer; and (d) implanting, into the single crystal semiconductor layer, impurity ions having the first conductivity by using the mask layer and the insulating sidewall as a mask, so that an emitter region adjacent to the base region is formed in the single crystal semiconductor layer. A portion of the single crystal semiconductor layer other than the base region and the emitter region is a collector region.

BRIEF DESCRIPTION OF THE DRAWINGS

Other objects, features and advantages of the present invention will become more apparent from the following detained description when read in conjunction with the accompanying drawings, in which:

FIG. 15B is an energy band diagram of the lateral bipolar transistor shown in FIG. 15A;

DESCRIPTION OF THE PREFERRED EMBODIMENTS

Figure 1:
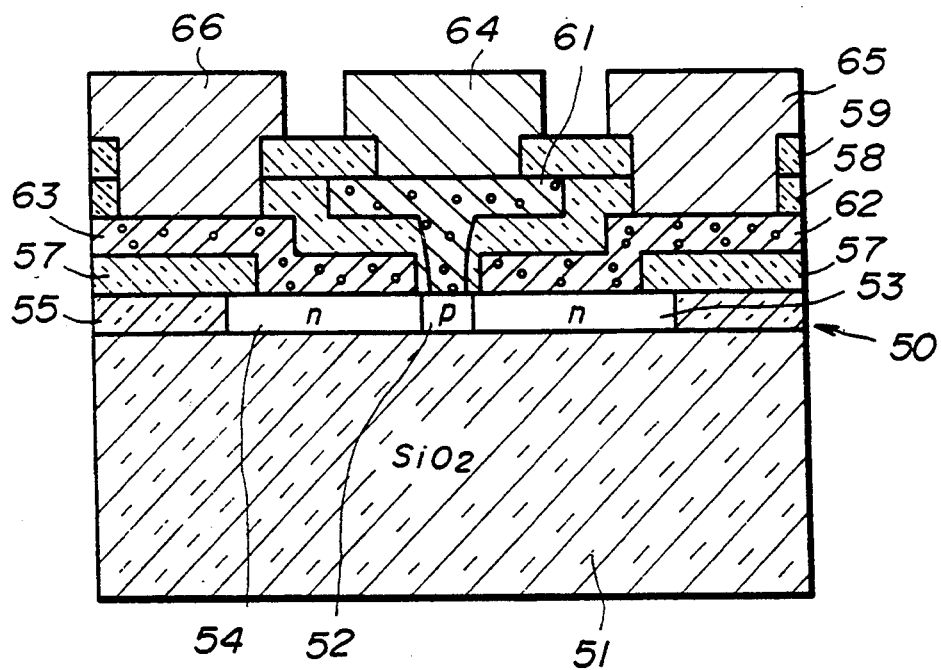
FIG. 1 is a cross-sectional view of a conventional lateral bipolar transistor.
Figure 2:
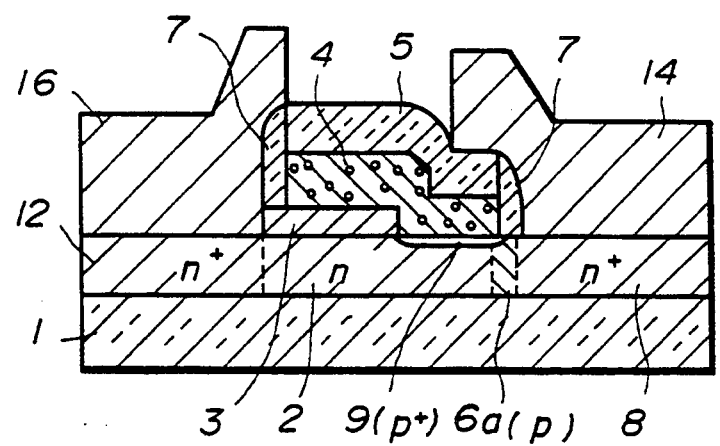
FIG. 2 is a cross-sectional view of a lateral bipolar transistor according to the first embodiment of the present invention.

A description will now be given of a first embodiment of the present invention. A single crystal semiconductor layer 2 is formed on an insulating layer 1. A lateral bipolar transistor is formed in the single crystal semiconductor layer 2. An $n^+$-type emitter region 8 is formed on the right side of the drawing. A narrow p-type base region 6a connected to the emitter region 8 is formed, on the left side of which an n-type emitter region and an $n^+$-type collector lead region 12 are formed as shown in FIG. 2. A $p^+$-type external base region 9 which is in contact with the p-type base region 6a is formed in a surface portion of the single crystal semiconductor layer 2.

A polycrystal semiconductor layer 4 containing a p-type impurity is formed on the external base region 9 via an opening formed in the insulating layer 3. An insulating layer 5 made of, for example, $SiO_2$, is formed on the polycrystal semiconductor layer 4. The polycrystal semiconductor layer 4 and the insulating layer 5 form a mask layer. An insulating region 7, which is an insulating (oxide) sidewall, is formed along the side surfaces of the mask layer. The sidewall 7 has a predetermined thickness.

The outer edge of the sidewall 7 on the right side of the drawing defines the $n^+$-type emitter region 8, and the outer edge of the sidewall on the left side of the drawing defines the collector lead region 12. An emitter electrode 14 formed of, for example, aluminum, is formed on the emitter region 8. A collector electrode 16 formed of, for example, aluminum, is formed on the collector real region 12.

The base region 6a and the emitter region 8 are formed by an ion implantation process. For the ion implantation process, an interface between the base region 6a and the emitter region 8 is substantially vertical to the surface of the single crystal layer 2. The impurity concentration in each of the base region 6a and the emitter region 8 is approximately constant at any point in the depth thereof.

In the above-mentioned process, the base region 6a can be formed which has a substantially equal thickness and a substantially uniform impurity concentration in the depth. With this process, it becomes possible to produce a high-performance lateral bipolar transistor.

A description will now be given, with reference to FIGS. 3A through 3C, of a process of producing the lateral bipolar transistor of the first embodiment of the present invention. The $SiO_2$ insulating film 3 is formed on the single crystal semiconductor layer 2 on the insulating substrate 1. Next, an opening is formed at the predetermined position on the insulating layer 3. After this, by a CVD process, the polycrystal semiconductor layer 4 is formed on the surface of the single crystal layer semiconductor layer 2, and successively the $SiO_2$ insulating layer 5 is formed on the polycrystal semiconductor layer 4. It should be noted that the term "polycrystal" has a broad concept including "amorphous".

A photoresist layer is formed on the polycrystal semiconductor layer 4 and the insulating layer 5, and patterned into a desired shape by an exposure process. In this manner, a photoresist mask is formed. Portions of the insulating layer 5 and the polycrystal semiconductor layer 4 on which the mask is not located are removed by, for example, a reactive ion etching (RIE) process. Then, the photoresist is also removed. In this manner, the layer structure shown in FIG. 3A is obtained. The polysilicon semiconductor layer 4 has been doped with a large amount of a p-type impurity by doping a source substance with the impurity or doping the patterned semiconductor layer 4 with the impurity.

A p-type impurity, such as boron ions, is implanted in the exposed portion of the single crystal semiconductor layer 2. In this process, the patterned polycrystal semiconductor layer 4 and insulating layer 5 function as a mask. In this manner, the p-type region 6 is formed.

Figure 3A:
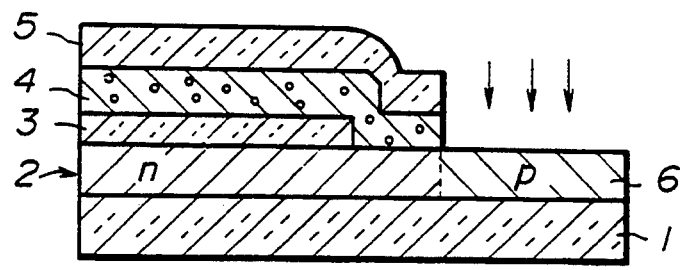
FIGS. 3A through 3C are cross-sectional views showing a process of producing the lateral bipolar transistor shown in FIG. 2.
Figure 3B:
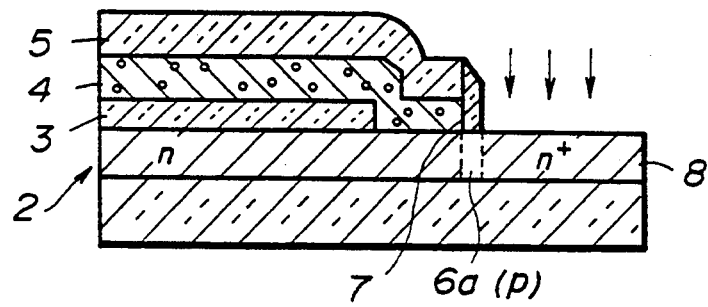

As shown in FIG. 3B, an insulating layer, such as an oxide or nitride layer, is deposited to a predetermined thickness on the entire surface. Then, an anisotropic etching, such as the RIE process, is carried out for the insulating layer. By the anisotropic etching, the insulating layer having the predetermined thickness is removed from the surface of the single crystal semiconductor layer 2 and the surface of the insulating layer 5. However, a portion of the insulating layer around the vertical edges of the polycrystal semiconductor layer 4 and the insulating layer 5 remains although this portion is partially etched at a top thereof. That is, the insulating layer 7 is the insulating sidewall. The thickness of the insulating sidewall 7 can be precisely controlled by controlling the thickness of the insulating layer. More specifically, the insulating sidewall 7 having an approximately constant thickness stands upright on the p-type semiconductor region 6.

Thereafter, n-type impurity ions, such as As ions, are implanted in the layer 2 in such a manner that the polysilicon semiconductor layer 4, the insulating layer 5 and the insulating sidewall 7 function as a mask. In this process, the $n^+$-type impurity region 8 is formed. During this process, the p-type region $6a$ having a predetermined width remains under the insulating sidewall 7. The remaining p-type region is the base region $6a$(i-type base region).

It should be noted that the base region having a thickness approximately equal to that of the sidewall 7 can be precisely formed by performing the ion implantation process twice, as shown in FIGS.3A and 3B.

Figure 3C:
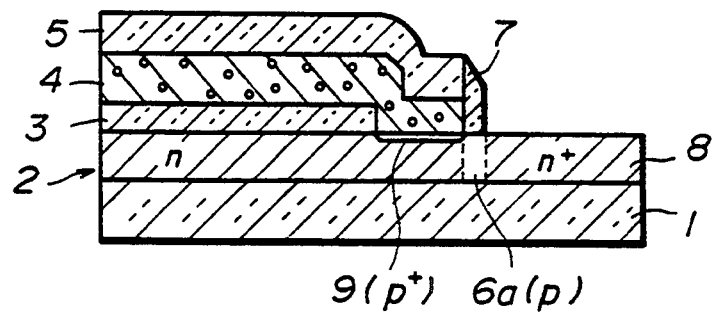

As shown in FIG. 3C, the semiconductor structure is heated to a predetermined temperature and maintained at this temperature during a predetermined period. Thereby, the p-type impurity is diffused into the single crystal semiconductor layer 2 from the polycrystal semiconductor layer 4, and hence the external base lead region 9 connected to the base region $6a$ is formed. The thickness of the insulating layer 7, such as an oxide or nitride film, is, for example 50–100 nm, and can be controlled at a precision equal to 10 nm or less. For this reason, it is possible to regulate the base width of the base region $6a$ at a precision equal to or less that 10 nm.

In the above-mentioned production process, the insulating layer 3 is formed to a thickness of, for example, 10–50 nm, on the single crystal semiconductor layer 2, and the polycrystal semiconductor layer 4 is formed to a thickness of, for example, 300 nm. Further, the insulating film 5 formed on the semiconductor layer 4 is, for example, 300 nm thick. The first ion implantation process for forming p-type region 6 is carried out by implanting boron ions at a concentration of, for example, 1E18 cm$^{-3}$. The single crystal semiconductor layer 2 contains the n-type impurity having a concentration of, for example, 1E17 cm$^{-3}$.

The insulating region 7 formed on the mask layer is formed with a silicon nitride film having a thickness of, for example, 50–100 nm. The second ion implantation process for forming the emitter region 8 shown in FIG. 3B is performed by implanting P ions (n-type impurity) at a concentration of, for example, 1E20 cm$^{-3}$. The first ion implantation process inverses the conductivity of the single crystal semiconductor layer 2, and the second ion implantation process inverses the conductivity obtained by the first ion implantation process.

FIGS.3A through 3C show the formation of only the base region and the emitter region. By adjusting the patterning of the polycrystal semiconductor layer 4 and the insulating layer 5, it becomes possible to form the $n^+$-type collector lead region 12 at the same time as the emitter region 8.

The lateral bipolar transistor has the base region having the constant width in the depth direction, and hence can operate at a high speed. The base electrode is electrically connected to the polycrystal base region 4 via the external base region 9 formed on the surface portion of the single crystal semiconductor layer 2. As a result, there is an asymmetrical layer structure regarding the depth direction.

Figure 4A:
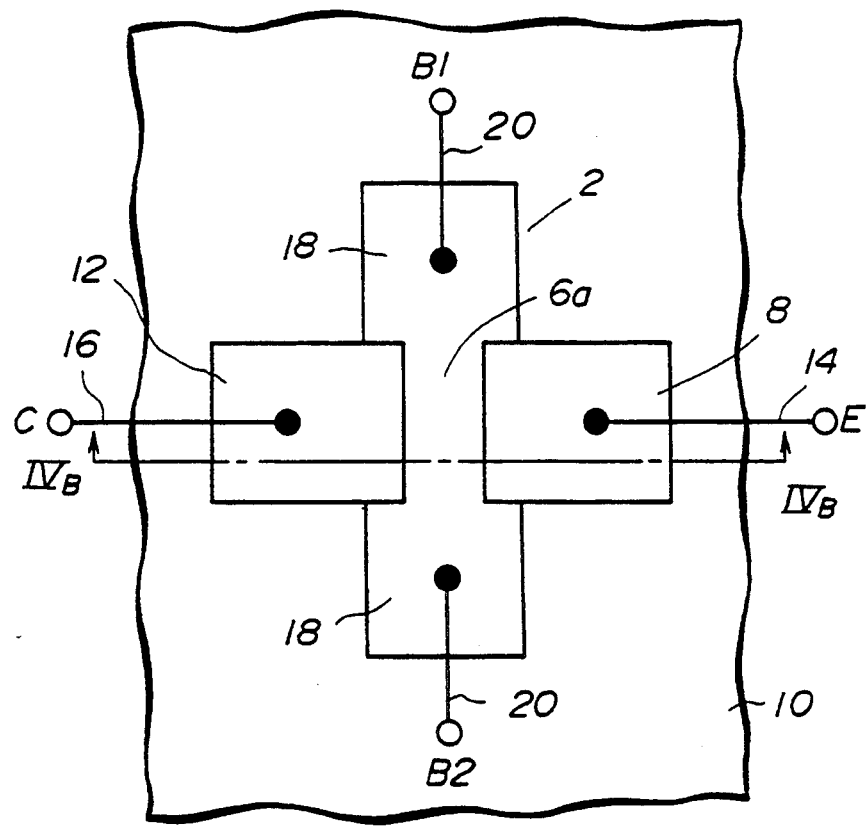
FIG. 4A is a plan view of a lateral bipolar transistor according to a second embodiment of the present invention.
Figure 4B:
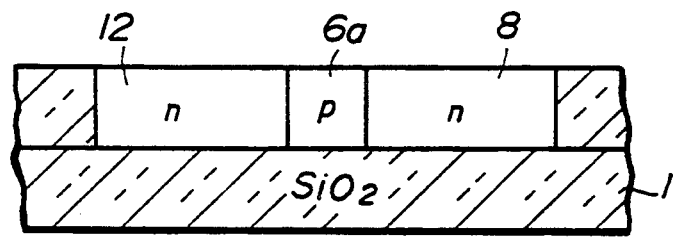
FIG. 4B is a cross-sectional view taken along a line $IV_B-IV_B$.

FIGS.4A and 4B show a lateral bipolar transistor having an approximately symmetrical layer structure in the depth direction according to a second embodiment of the invention. In the second embodiment of the present invention, the single crystal semiconductor layer on the insulating substrate is selectively oxidized so that a substantially cross-shaped element formation region surrounded by an element isolation region 10 remains. External base regions 18 are formed in opposing branch portions of the cross-shaped element formation region. The emitter region 8 and the collector region 12 are formed in the other opposing branch portions of the cross-shaped element formation region. Base electrodes 20 are connected to the external base regions 18, and an emitter electrode 14 is connected to the emitter region 8. A collector electrode 16 is connected to the collector region 12.

The intrinsic base region $6a$ interposed between the emitter region 8 and the collector region 12 is coupled to the base electrodes 20 via the external base regions 18. Hence, the base region 18 has a symmetry in the depth direction. As a result, it becomes possible to provide the lateral bipolar transistor in which the entire thickness of the single crystal semiconductor layer is efficiently used.

Figure 5:
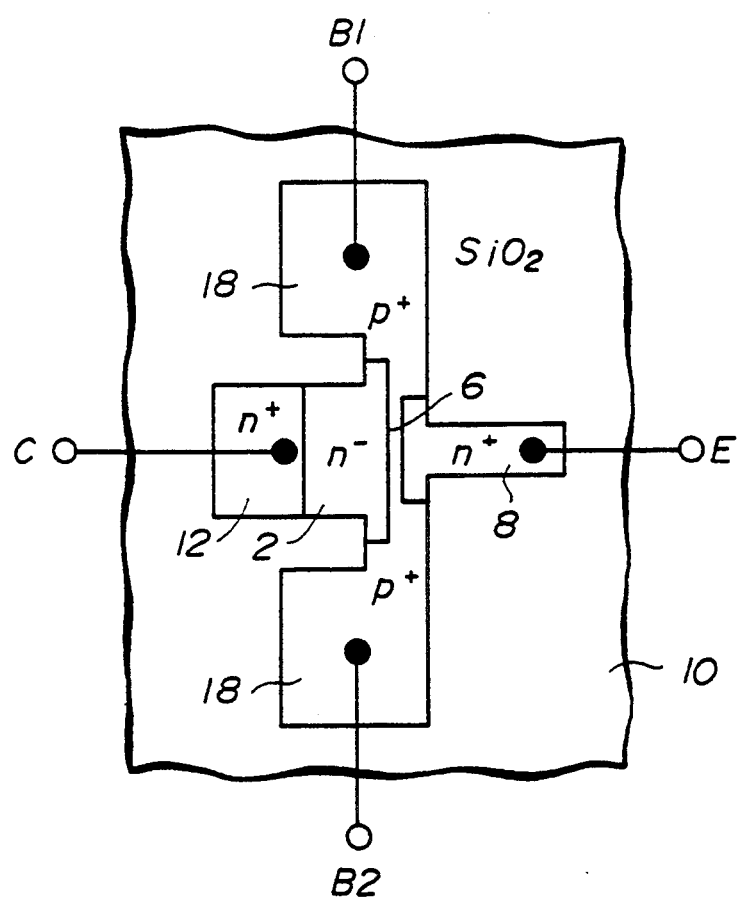
FIG. 5 is a plan view showing the structure shown in FIG. 4A in more detail.

FIG. 5 shows the structure shown in FIG. 4A in more detail. In the element formation region surrounded by the element isolation region 10, there are formed the intrinsic base region $6a$, the external base regions 18 located on upper and lower sides of the region $6a$, the collector regions 2 and 12 located on left and right sides of the region $6a$, and the emitter region 8 on the right side of the region $6a$. The collector region is composed of the $n^-$-type active collector region 2, and the $n^+$-type collector lead region 12. The $n^+$-type emitter region 8 is spaced apart from the $n^-$-type active collector region 2 through a predetermined gap, within which the i-type base region 6a is defined. The external base regions 18 are formed on the upper and lower sides of the i-type base region 6a.

A description will now be given, with reference to FIGS. 6A through 6C and 7A through 7D, of a process of producing the thin i-type base region 6a of the lateral bipolar transistor shown in FIG. 5. FIGS. 7A through 7D are respectively cross-sectional views taken along lines $VII_A$—$VII_A$, $VII_B$—$VII_B$, $VII_C$-$VII_C$, and $VII_D$—$VII_D$ shown in FIGS. 6A through the 6C.

Figure 6A:
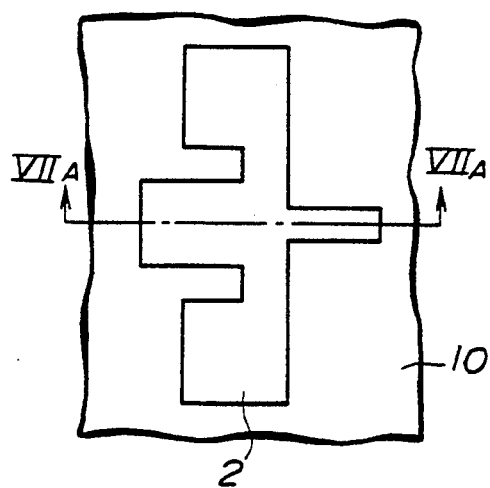
FIGS. 6A through 6C are plan views showing a process of producing the lateral bipolar transistor shown in FIG. 5.
Figure 6C:
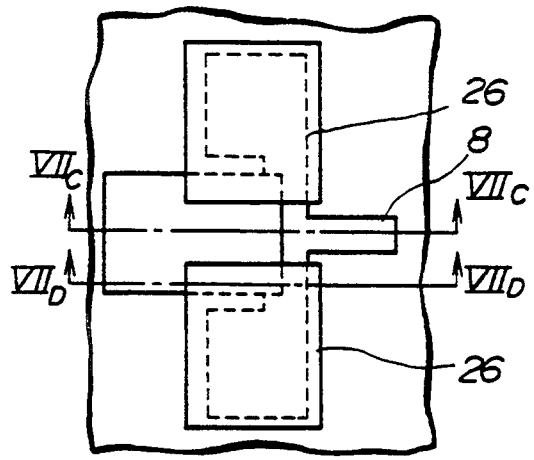
Figure 7A:
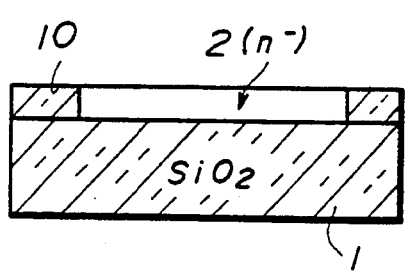
FIGS. 7A through 7D are cross-sectional views taken along lines $VII_A-VII_A$, $VII_B-VII_B$, $VII_C-VII_C$, and $VII_D-VII_D$.

First, an SOI substrate having the n-type single crystal silicon layer 2 is formed on the insulating substrate 1. Next, as shown in FIGS. 6A and 7A, the single crystal silicon layer 2 is oxidized so that the element formation region and the element isolation region 10 are formed. For example, a nitride film is formed on the single crystal semiconductor layer, which is then patterned by using the photoresist layer. In this manner, a nitride mask corresponding to the element formation region is formed. Subsequently, the portion of the single crystal silicon layer other than the portion thereof covered by the nitride mask is oxidized, and hence the element insulation region 10 is formed. After this, the nitride film is removed, so the single crystal semiconductor layer 2 serving as the element formation region is formed. When the npn bipolar transistor is formed, the single crystal semiconductor layer 2 is an $n^-$-type region having an impurity concentration of $1E17$ $cm^{-3}$.

The surface of the single crystal semiconductor layer 2 is oxidized so that a silicon oxide film 21 having a thickness of 10–50 nm is formed. A resist layer is formed on the silicon oxide film 21, which is then patterned by the photolithographic process so that a contact hole 24 (FIG. 7B) for the collector lead electrode is formed therein.

Figure 6B:
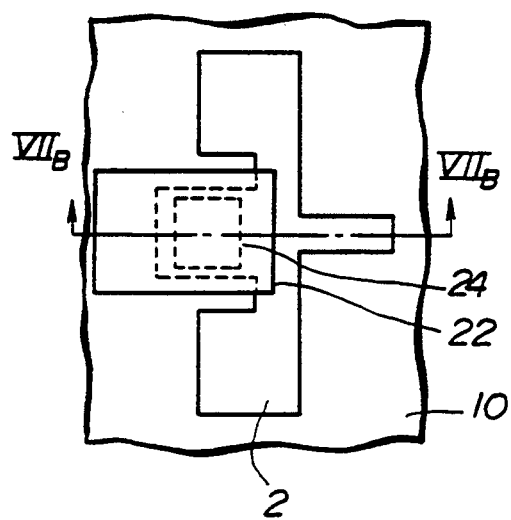
Figure 7B:
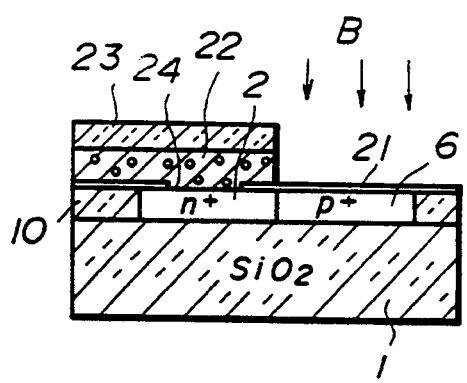

As shown in FIGS. 6B and 7B, an $n^+$-type polysilicon layer 22 is formed to 300 nm and patterned so that the polycrystal collector lead region 22 is formed. The polycrystal collector lead region 22 is in contact with the $n^-$-type collector region 2 via the contact hole 24 formed in the silicon oxide film 21.

An insulating layer 23, such as a silicon oxide layer, is deposited to 300 nm on the polycrystal collector lead region 22 so that it is covered by the insulating layer 23. A photoresist layer is formed on the insulating layer 23, and patterned by the RIE process so that mask layers composed of the layers 22 and 23 shown in FIGS. 6B and 7B are formed. The mask layers 22 and 23 have respective side surfaces which stand vertically.

Thereafter, a p-type impurity, such as boron ions are implanted at a concentration of approximately $1E18$ $cm^{-3}$ so that the $p^+$-type region 6 is formed outside of the mask layers 22 and 23.

Figure 7C:
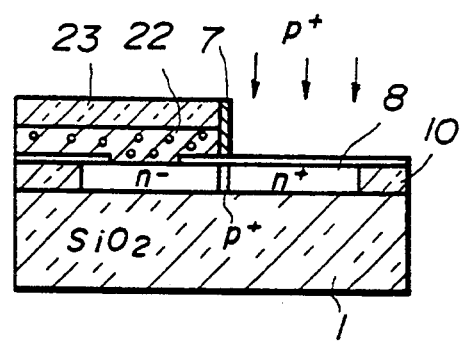
Figure 7D:
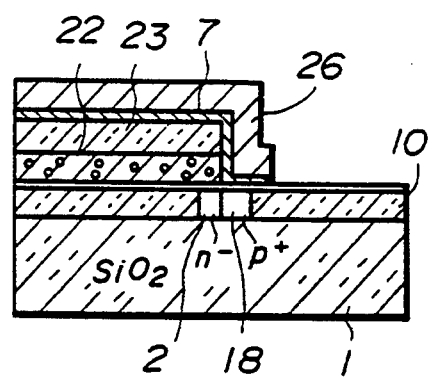

Then, a silicon nitride film is deposited to a predetermined thickness, and selectively etched by the anisotropic etching process so that only the silicon nitride film 7 formed along the side surfaces of the mask layers 22 and 23 remains, as shown in FIG. 7C. After this, n-type impurity ions, such as P ions, are implanted from the upper side of the substrate so that the $p^+$-type region 6 is changed to the $n^+$-type region 8. A photoresist layer 26 is formed on the external base region, in which the ions are not implanted, as shown in FIG. 7D.

In the above manner, only the p-type region which will be changed to the emitter region is doped with a large amount of n-type impurity, so the p-type region is changed to the $n^+$-type emitter region 8, which has an impurity concentration of, for example, $1E20$ $cm^{-3}$. After that, the photoresist layer 26 and the nitride film 7 are removed, and predetermined electrodes are formed. In the above-mentioned manner, the lateral bipolar transistor shown in FIG. 5 is produced.

According to the second embodiment of the present invention, the base width of the lateral bipolar transistor is controlled by the thickness of the nitride film 7 formed along the side surfaces of the mask layers 22 and 23. It is possible to form the base region having a constant thickness in the depth direction at a precision equal to, for example, 10 nm.

A description will now be given of a third embodiment of the present invention with reference to FIG. 8.

Figure 8:
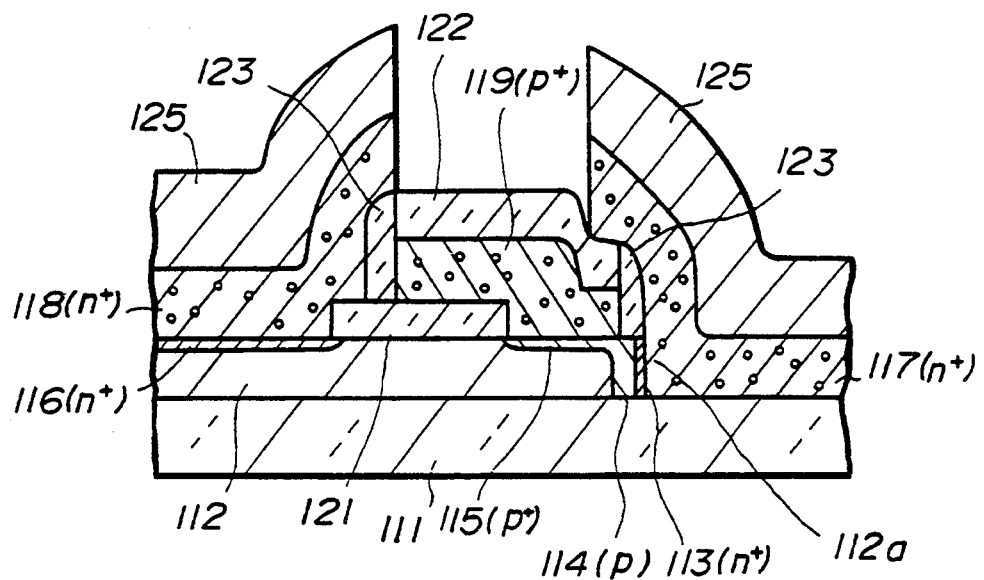
FIG. 8 is a cross-sectional view of a lateral bipolar transistor according to a third embodiment of the present invention.

Referring to FIG. 8, a single crystal semiconductor layer 112, such as an n-type single crystal silicon layer, is arranged on an insulating substrate 111, such as an $SiO_2$ layer or an insulating substrate having a surface on which an insulating layer made of, for example, $SiO_2$ is formed. The single crystal semiconductor layer 112 forms an n-type collector region. The single crystal semiconductor layer 112 has a side surface 112a, which stands upright on the insulating substrate 111. By diffusing an impurity into the single crystal layer 112 through the side surface 112a, a p-type base region 114 is formed therein. After the p-type base region 114 is formed, an $n^+$-type polysilicon region 117 having a large amount of an n-type impurity is formed so that it is in contact with the side surface 112a. By diffusing an impurity into the single crystal semiconductor layer 112 from the $n^+$-type polysilicon region 117, a shallow $n^+$-type emitter region 113 is formed therein. That is, the base and emitter regions of the lateral bipolar transistor are formed by a solid phase double diffusion process.

A p-type polysilicon region 119 is formed on the single crystal semiconductor layer 112 so that the region 119 is spaced apart from the $n^+$-type polysilicon region 117 via an oxide sidewall 123. By diffusing an impurity into the single crystal semiconductor layer 112 from the $p^+$-type polysilicon region 119, a $p^+$-type external base region 115 is formed, which is connected to the aforementioned p-type base region 114.

As shown in FIG. 8, an $n^+$-type polysilicon region 118 is formed on an exposed surface portion of the single crystal semiconductor layer located on a side of the insulating layer 121 opposite to a side thereof on which the $p^+$-type external base region 115 is formed. By diffusing an impurity into the single crystal semiconductor layer 112 from the $n^+$-type polysilicon region 118, an $n^+$-type ohmic contact region 116 is formed in the surface portion of the single crystal semiconductor layer 112. Metallic electrodes 125 are respectively formed on the polysilicon regions 117 and 118.

A description will now be given of the process of forming the base regions 114 and 115 with reference to FIGS. 9A through 9D.

Figure 9A:
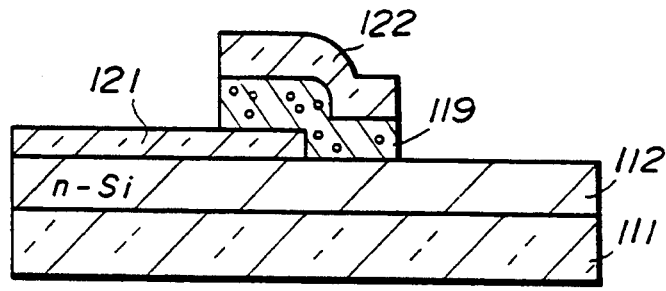
FIGS. 9A through 9D are cross-sectional views showing a process of producing a base region of the lateral bipolar transistor shown in FIG. 8.

As shown in FIG. 9A, the n-type single crystal semiconductor layer 112 is formed on the insulating substrate 111. A surface of the n-type single crystal semiconductor layer 112 is selectively covered by the insulating layer 121. Then, the $p^+$-type polysilicon region 119 is formed so that it extends from the surface of the insulating layer 121 and reaches the surface of the single crystal semiconductor layer 112. The polysilicon region 119 can be formed by depositing polysilicon and doping it with the impurity or by depositing impurity-doped polysilicon. The insulating film 122 made of, for example, $SiO_2$, is formed on the polysilicon region 119, and a photoresist is formed on the insulating film 122. After this, the insulating layer 122 and the polysilicon region 119 are patterned by the photolithographic process.

Figure 9B:
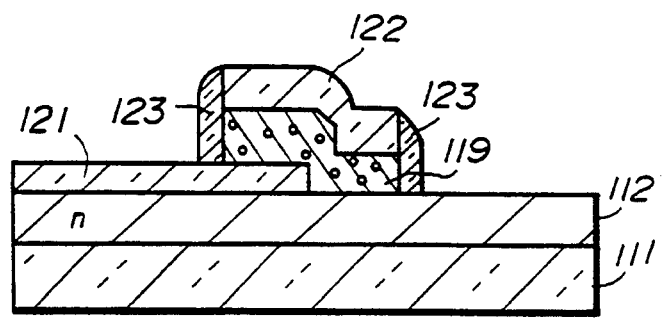

As shown in FIG. 9B, the insulating film 123, such as an oxide film, is deposited on the entire surface, and selectively removed by the anisotropic etching process. In this manner, the insulating layer 123 partially remains along the sidewalls of the layers 119 and 122. The polysilicon region 119 is surrounded by the insulating layer 123.

Figure 9C:
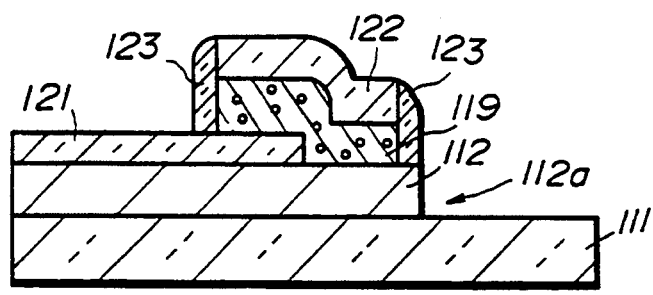

As shown in FIG. 9C, the single crystal semiconductor layer 112 is selectively etched by the anisotropic etching, such as, the RIE process, in such a manner that the insulting layer 123 serves as a mask film. By this etching process, the single crystal semiconductor layer 112 has a substantially vertical side surface 112 on the insulating substrate 111.

Figure 9D:
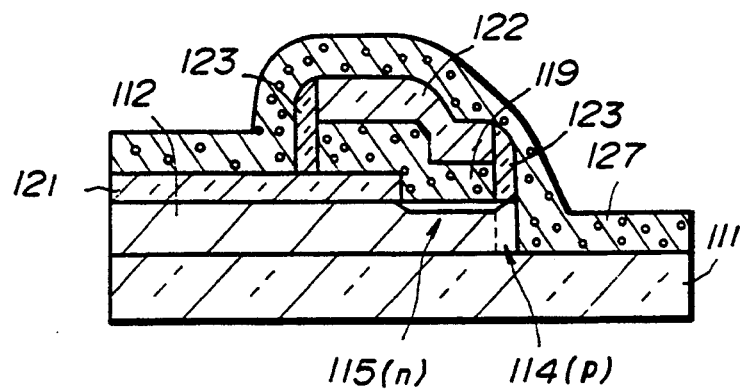

As shown in FIG. 9D, a boron silicate glass (BSG) layer 127 containing boron is deposited so that it covers the exposed surface 112a of the single crystal semiconductor layer 112. By diffusing the p-type impurity into the single crystal semiconductor layer 112 from the p+-type polysilicon region 119 and the BSG film 127, the p+-type external base region 115 is formed in the surface portion thereof, and the p-type internal base region 114 is formed in a side portion of the single crystal semiconductor layer 112. The p-type internal base region 114 has a constant width from the side surface 112a in the lateral direction, and is connected to the p+-type external base region 115 at a top portion of the region 114.

Figure 10A:
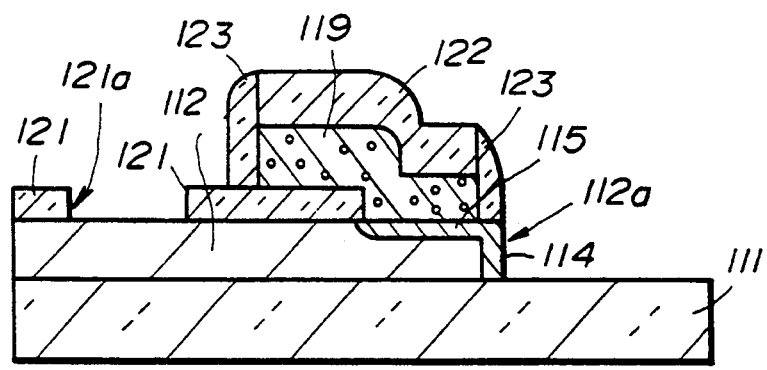
FIGS. 10A and 10B are cross-sectional views showing a process of producing a collector region of the transistor shown in FIG. 8.
Figure 10B:
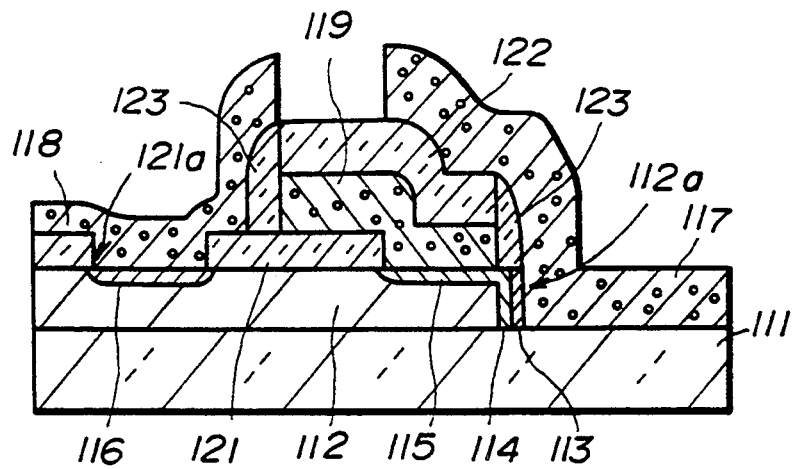

FIGS. 10A and 10B show showing how to form the emitter and collector regions of the lateral bipolar transistor according to the third embodiment of the present invention.

As shown in FIG. 10A, after the internal base region 114 and the external base region 115 are formed, the BSG film functioning as the impurity source is removed, and an opening 121a for the collector region is formed in the insulating layer 121. Thereafter, as shown in FIG. 10B, a polysilicon layer containing a large amount of the n-type impurity is deposited on the entire surface, and patterned so that the n+-type polysilicon regions 117 and 118 having respective desired shapes are formed. The polysilicon region 117, which forms the polycrystal emitter region, is in contact with the vertical side surface 112a of the single crystal semiconductor layer 112. The n+-type polysilicon region 118, which forms the polycrystal collector region, is in contact with the single crystal semiconductor layer 112 via the opening 121a formed in the insulating film 121. The impurity is diffused into the single crystal semiconductor layer 112 through the regions 117 and 118, the polycrystal emitter region 113 and the polycrystal collector region 116 are formed.

The important parameter which determines the operation speed of the lateral bipolar transistor shown in FIG. 8 is the width of the base region 114. In the structure shown in FIG. 8, the width of the base region 114 is determined by a width (range) within which the impurity is diffused from the BSG film 127 deposited at the step shown in FIG. 9D as well as a width (range) within which the impurity is diffused from the n+-type polysilicon region 117. It is possible to precisely control the above impurity diffusion ranges by controlling the temperature and time of the diffusion process. As a result, it is possible to precisely form the thin base region 114 having a thickness equal to or less than 0.1 μm.

It will be noted that the collector ohmic region 116 is formed on the surface of the single crystal semiconductor layer 112, and hence the structure shown in FIG. 8 is somewhat asymmetrical.

Figure 11:
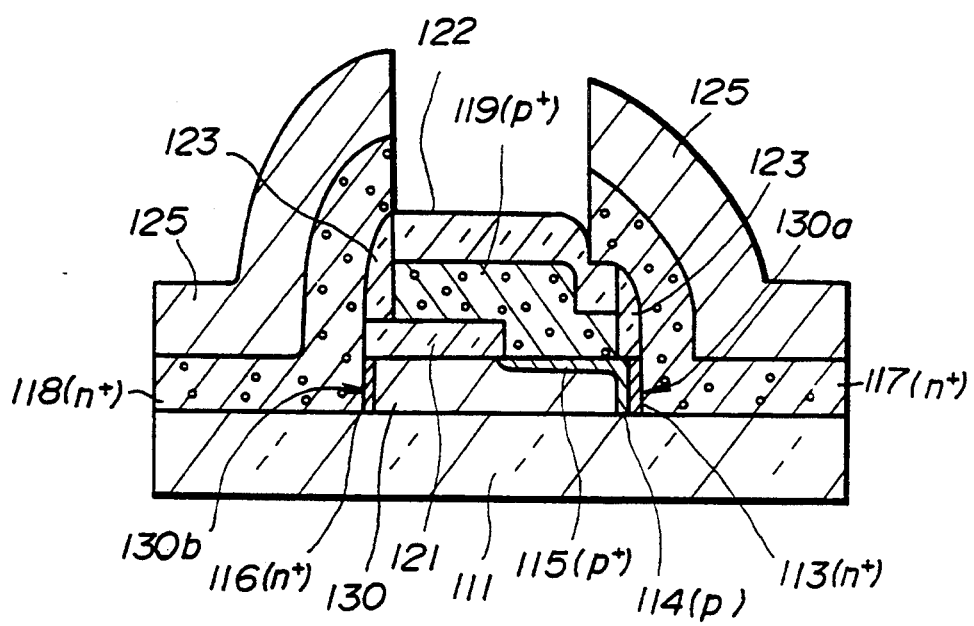
FIG. 11 is a cross-sectional view of a lateral bipolar transistor according to a fourth embodiment of the present invention.

FIG. 11 shows a fourth embodiment of the present invention having a symmetrical layer structure. In FIG. 11, parts which are the same as those shown in the previous figures are given the same reference numerals. A single crystal semiconductor layer 130 is patterned so that not only a right surface 130a thereof but also a left surface 130b thereof match the oxide sidewall 123 as if it is formed by a self-alignment process. This structure of the single crystal semiconductor layer 130 is different from that of the single crystal semiconductor region 112 shown in FIG. 8. The n+-type polysilicon region 118a is deposited on the left surface 130b, and the n+-type collector ohmic region 116 is formed in the single crystal semiconductor layer 130 by diffusing the impurity from the polysilicon region 118a. The collector ohmic region 116 has a shape having a mirror relationship with the shape of the emitter region 113 located on the right surface 130a of the semiconductor layer 130. That is, the lateral bipolar transistor shown in FIG. 11 has a substantially symmetrical layer structure. As a result, it is possible to efficiently utilize the entire thickness of the single crystal semiconductor layer 130.

Figure 12A:
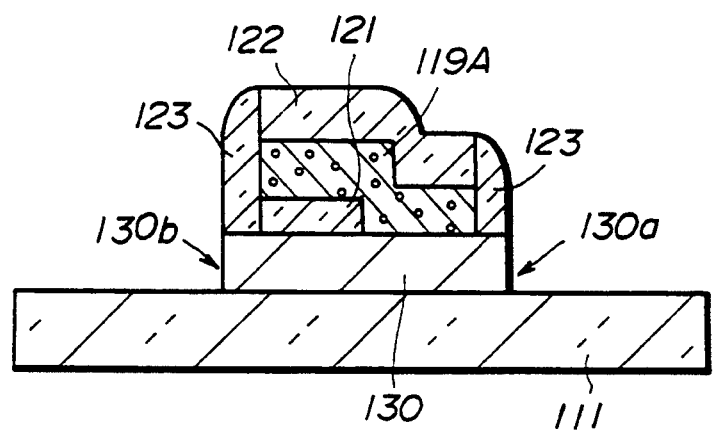
FIGS. 12A and 12B are cross-sectional views of the lateral bipolar transistor shown in FIG. 11.
Figure 12B:
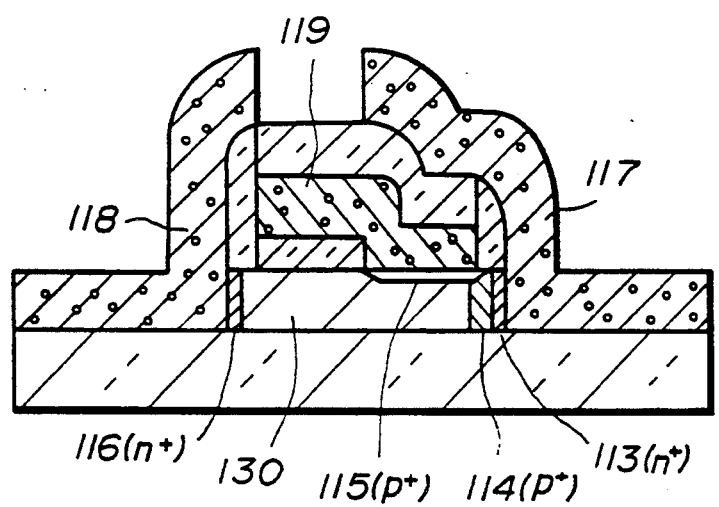

FIGS. 12A and 12B show a process of producing the lateral bipolar transistor shown in FIG. 11. As shown in FIG. 12A, the polycrystal semiconductor layer 119a, the insulating layer 122 and the oxide sidewall 123 are formed on the single crystal semiconductor layer. After this, the single crystal semiconductor layer 130 is etched by the anisotropic etching process, such as the RIE process, in which the sidewall 123 functions as a mask layer. In this manner, the single crystal semiconductor layer 130 is patterned so that it has the side surfaces 130a and 130b.

Thereafter, an n+-type polycrystal semiconductor layer is deposited so that it is in contact with the side surfaces 130a and 130b, and patterned so that the n-type polycrystal semiconductor emitter layer 117 and the n-type polycrystal semiconductor collector layer 118 are formed. Then, the impurity is diffused into the patterned single crystal semiconductor layer 130 from the emitter layer 117 and the collector layer 118. In this manner, the n+-type emitter region 113, the p-type base region 114, the p+-type external base region 115, and the n+-type collector region 116 are formed in the single crystal semiconductor layer 130.

The dimension of the single crystal semiconductor layer 112 in the lateral direction can be changed based on various conditions, such as breakdown voltages of the lateral bipolar transistor. The base region formed by diffusing the impurity from the emitter region side generates a drift electric field, which transports carriers at a high speed. Hence, the lateral bipolar transistor shown in FIG. 11 can operate at a high speed.

A description will now be given of a fifth embodiment of the present invention with reference to FIG. 13. An n-type contact layer 216 formed with an n-type silicon layer is formed on an insulating substrate 202. A p-type base region 220 is formed on a side of the n-type contact layer 216. An n+-type emitter region 228 is formed on a side of the n-type base region 220. The thickness of the n-type base region 220 in the horizontal direction sandwiched between the n-type contact layer 216 and the n+-type emitter region 228 is equal to or less than 0.1 μm. A p+-type base lead region 222 is formed on the surface of the n-type contact layer 216, and linked to the p-type base region 220.

A p+-type base lead electrode 208 is formed on the p+-type base lead region 222. An n+-type collector lead electrode 223 is formed, through the n+-type collector lead electrode 226, on the n-type contact layer 216. An n+-type lead electrode 224 is formed so that it is in contact with the n+-type emitter region 228. The n+-type emitter lead electrode 208 is isolated from the n+-type collector lead electrode 223 and the n+-type emitter lead electrode 224 by a thermally oxidized film 206, a sidewall 214 and a nitride film 210.

A metallic collector electrode 230 and a metallic emitter electrode 232 are formed on the n+-type collector lead electrode 223 and the n$^{30}$-type emitter lead electrode 224, respectively. Although not shown for the sake of simplicity, a metallic base electrode is formed which is in contact with the p$^{30}$-type base lead electrode 208 via a contact window formed in the nitride film 210.

A description will now be given, with reference to FIGS. 14A through 14G, of a process of producing the lateral bipolar transistor shown in FIG. 13. The n-type silicon layer 204 is formed on the insulating substrate 202. By the thermal oxidization process, the thermal oxide film 206 is formed on the n-type silicon layer 204, and patterned into a predetermined shape. Subsequently, a polysilicon layer is deposited on the entire surface, and doped with the p-type impurity. The nitride film 210 is formed on the p+-type polysilicon layer, and then patterned into a predetermined shape. After this, the p+-type polysilicon layer is etched in such a manner that the patterned nitride film 210 is used as a mask. In this manner, the p+-type base lead electrode 208 having a step shape is formed on the n-type silicon layer 204 and the thermal oxide film 206. In this process, the width of the base lead electrode 208 which is in contact with the n-type silicon layer 204 is defined by the precision of the photolithographic process (see FIG. 14A).

Figure 14A:
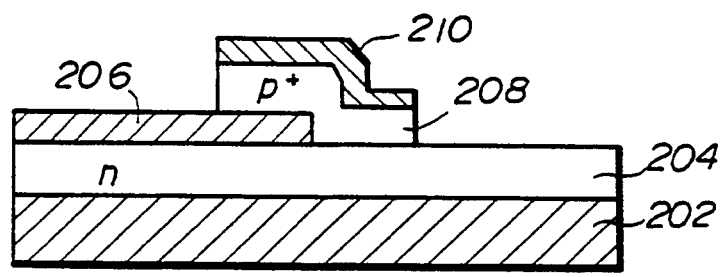
FIGS. 14A through 14G are cross-sectional views showing a process of producing the lateral bipolar transistor shown in FIG. 13.
Figure 14B:
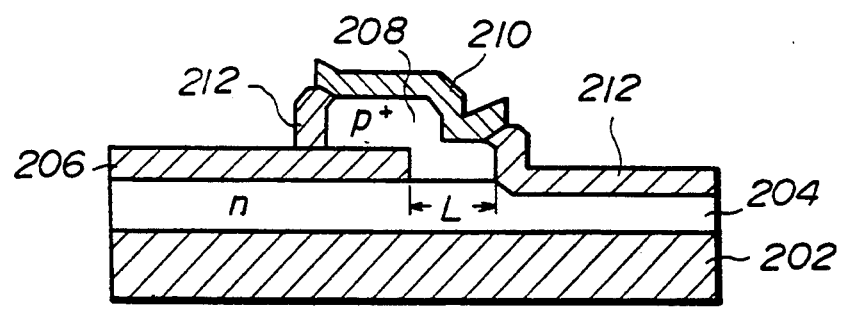

Thereafter, a selective oxidization process is carried out in which the nitride film 210 which is an oxidization-resistant insulating layer is used as a mask. In this manner, the thermal oxide film 212 is formed along the side surface of the base lead electrode 208 and the n-type silicon layer 204. During this process, oxidizing horizontally progresses from the side surface of the base lead electrode 208, and hence the thermal oxide film 212 extends up to under the nitride film 210. By controlling the progress of oxidization from the side surface of the base lead electrode 208 in the horizontal direction, it is possible to precisely control, beyond a photolithographic minimum dimension, the width L along which the base lead electrode 208 and the n-type silicon layer 204 are in contact with each other (FIG. 14B).

Figure 14C:
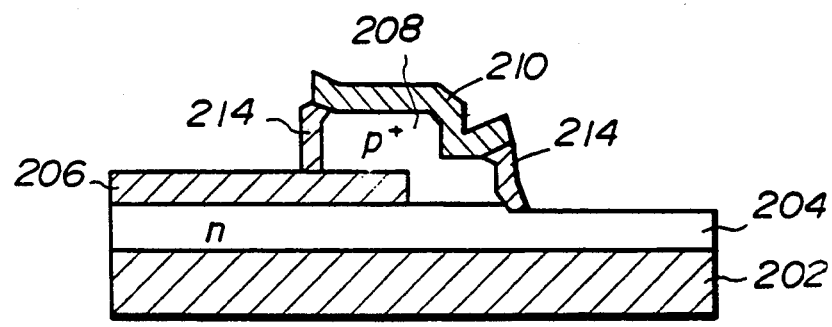
Figure 14D:
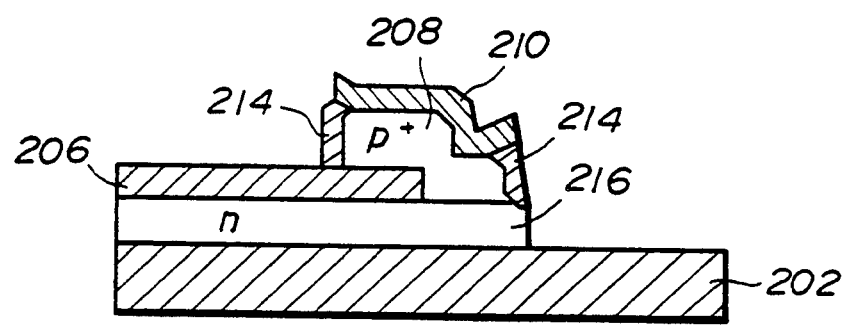

By using the nitride film 210 as a mask, the thermal oxide film 212 is etched back so that the thermal oxide film 212 remains along the side surface of the base lead electrode 208. The remaining thermal oxide film 212 forms the sidewall 214. During the etch-back process, the terminal oxide film 206 is not removed (FIG. 14C). Subsequently, an n-type silicon layer 204 is etched by using the thermal oxide film 206, the nitride film 210 and the sidewall 214 as a mask. In this manner, the n-type contact layer 216 formed with the n-type silicon layer 204 (FIG. 14D).

Figure 14E:
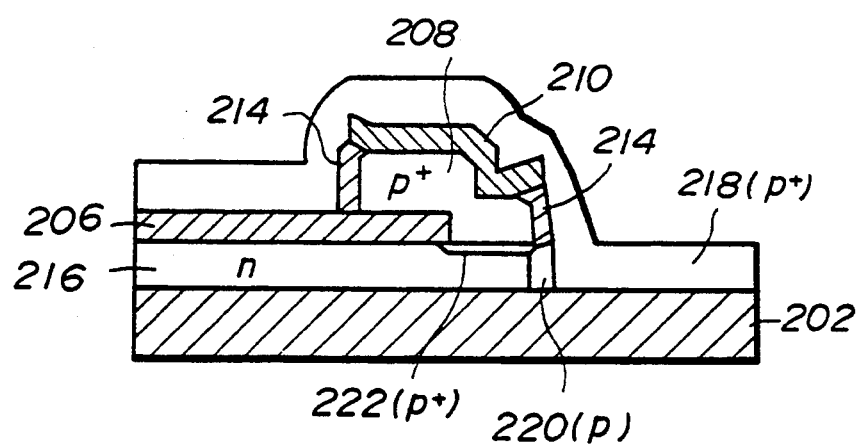

Then, the BSG (Boron Silicate Glass) layer 218 serving as a solid phase diffusion source containing a p-type impurity is coated on the entire surface. Thereafter, a thermal process is carried out in order to diffuse the p-type impurity into the side surface of the n-type contact layer 216 from the BSG layer 218. In this manner, the p-type base region 220 is formed. Simultaneously, the p-type impurity is diffused into the surface of the n-type contact layer 216 from the p+-type base lead electrode 208, so the p+-type base lead electrode 222 is formed. The condition of this diffusion is selected so that the p+-type base lead region 222 is formed in a shallow surface portion of the n-type contact layer 216 and linked to the p-type base region 220 (FIG. 14E).

Figure 14F:
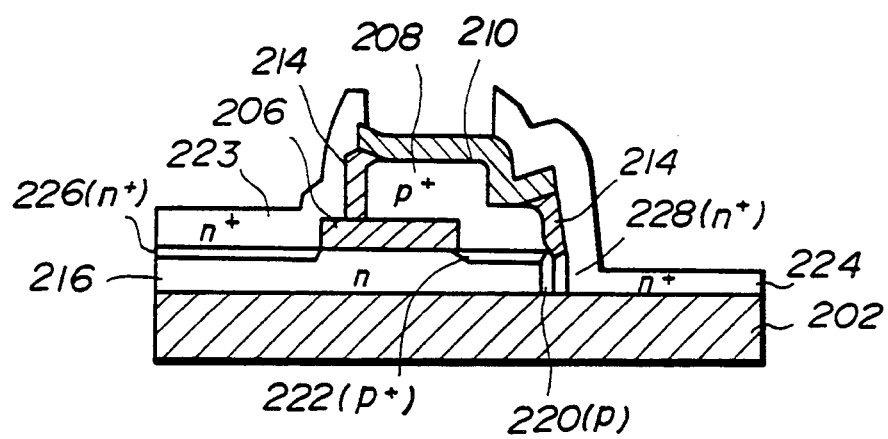

Thereafter, the BSG film 218 is removed, and the thermal oxide film 206 is etched by using a resist having a predetermined shape as a mask so that the surface of the n-type contact layer 216 is exposed. Then, a polysilicon layer is deposited on the entire surface, and As ions are implanted in the polysilicon layer. Subsequently, the n+-type polysilicon layer thus formed is patterned into a predetermined shape so that there are formed the n+-type collector lead electrode 223 on the n-type contact layer 216, and the n+-type emitter lead electrode 224 which is formed on the insulating substrate 202 and which is in contact with the p-type base region 220 (FIG. 14F).

A subsequent thermal oxidization process is carried out in which the impurity derived from the n+-type collector lead electrode 223 is diffused into the surface of the n-type contact layer 216 so that the n+-type collector lead region 226 is formed. Simultaneously, the impurity derived from the n+-type emitter lead electrode 224 is diffused into the p-type base region 220 so that the n-type emitter region 228 is formed. It becomes possible to adjust the horizontal thickness of the p-type base region 220 sandwiched between the n-type contact layer 216 and the n+-type emitter region 228 by controlling the diffusion condition for forming the n+-type emitter region 228 as well as the diffusion condition for forming the p-type base region 220 shown in FIG. 14E. According to the present embodiment, it is possible to form the p-type base region 220 so that it has a thickness less than or equal to 0.1 μm.

Figure 13:
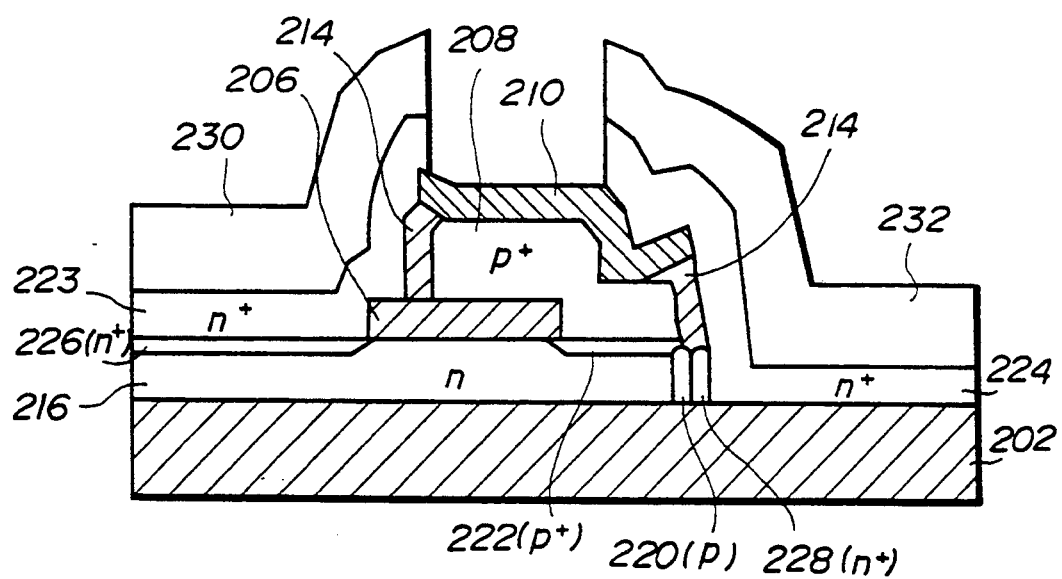
FIG. 13 is a cross-sectional view of a lateral bipolar transistor according to a fifth embodiment of the present invention.
Figure 14G:
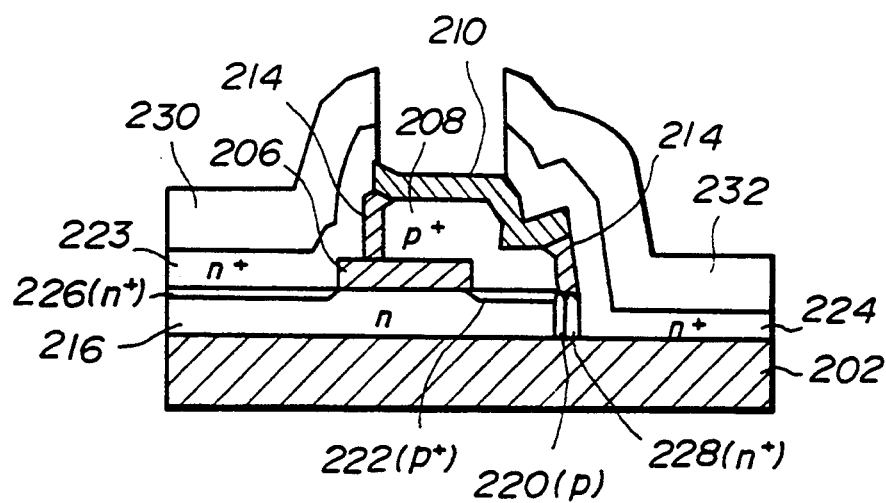

Subsequently, the metallic collector electrode 230 and the metallic emitter electrode 232 are formed on the n+-type collector lead electrode 223 and the n+-type emitter lead electrode 224, respectively (FIG. 14G). Although not shown for the sake of simplicity, a metallic base electrode which is in contact with the p+-type base lead electrode 208 via a contact window formed in the nitride film 210 is formed. In this manner, the lateral bipolar transistor shown in FIG. 13 is formed.

According to the above-mentioned fifth embodiment of the present invention, it is possible to precisely control, beyond a photolithographic minimum dimension, the width L (contact area) along which the base lead electrode 208 and the n-type silicon layer 204 are in contact with each other by control the selective thermal oxidization process which progresses from the side surface of the base lead electrode 208 in the horizontal direction. Hence, it becomes possible to reduce the width up to a minimum value necessary for an ohmic contact between the n+-type base lead region 222 and the base lead electrode 208. As a result, it also becomes possible to reduce a base-collector capacitance and hence improve the performance of the transistor.

Further, it becomes possible to decrease the thickness of the p-type base region 220 to 0.1 μm or less by controlling the double diffusion, that is, controlling the conditions for forming the p-type base region 220 shown in FIG. 14E and the n+-type emitter region 228. By reducing the thickness of the base region 220, the disadvantage of the prior art, that is, the difficult leading of the base electrode, can be overcome by forming the p+-type base lead region 222 by the self-alignment process shown in FIG. 14E.

The entire emitter is composed of the n+-type emitter region 228 and the n+-type emitter lead electrode 224 connected thereto by diffusing the impurity from the n+-type emitter lead electrode 224 into the side surface of the p-type base region 220. That is, the emitter has a so-called polysilicon emitter structure, which improves the operation speed and the current transfer ratio $h_{FE}$ of the transistor.

A description will now be given of a sixth embodiment of the present invention with reference to FIG. 15A, in which those parts which are the same as those shown in FIG. 13 are given the same reference numerals.

The n-type contact layer 216 is formed on the insulating substrate 202, and the p-type base region 220 is formed along the side surface of the n-type contact layer 216. The p+-type base lead region 222 is formed on the n-type contact layer 216, and linked to the p-type base region 220. An n+-type silicon carbide (SiC) emitter region 238 having a band gap wider than that of silicon is formed along the side surface of the p-type base region 220.

The p+-type base lead electrode 208 is formed on the p$^{30}$-type base lead region 222. The metallic collector electrode 230 is formed on the n-type contact layer 216. The n+-type emitter lead electrode 224 is formed on the n+-type SiC emitter region 238. The metallic emitter electrode 232 is formed on the n+-type emitter lead electrode 224. The p+-type base lead electrode 208 is insulated from the metallic collector electrode 230, the n+-type SiC emitter region 238, the n+-type emitter lead electrode 224 and the metallic emitter electrode 232 by the thermal oxidization film 206, the sidewall 236 and the thermal oxidization film 234.

A description will now be given, with reference to FIGS. 16A through 16G, of a process of producing the lateral bipolar transistor shown in FIG. 15A.

Figure 16A:
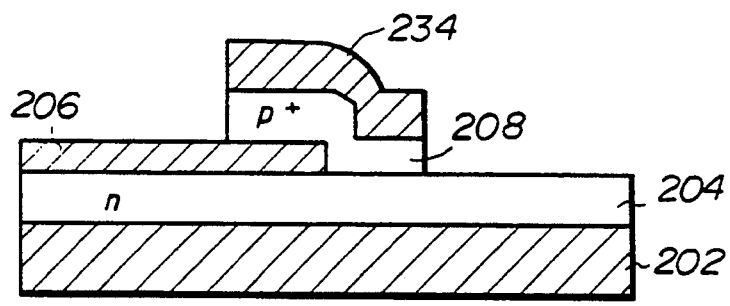
FIGS. 16A through 16G are cross-sectional views showing a process of producing the lateral bipolar transistor shown in FIG. 15.

As shown in FIG. 16A, the n-type silicon layer 204 is formed on the insulating substrate 202. The thermal oxidization film 206 having a predetermined pattern is formed on the n-type silicon layer 204. After this, a p+-type polysilicon layer is deposited on the entire surface. The thermal oxidization film 234 having a predetermined pattern is formed on the p+-type polysilicon layer, which is etched by using the oxide film 234 as a mask. In this manner, the p+-type base lead electrode 208 having a step form is formed on the n-type silicon layer 204 and the thermal oxidization film 206.

Figure 16B:
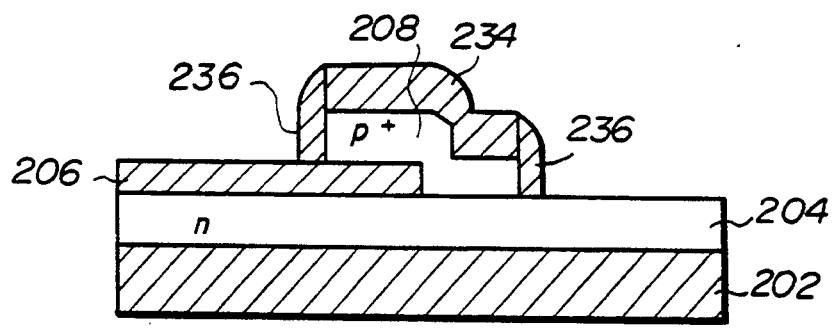
Figure 16C:
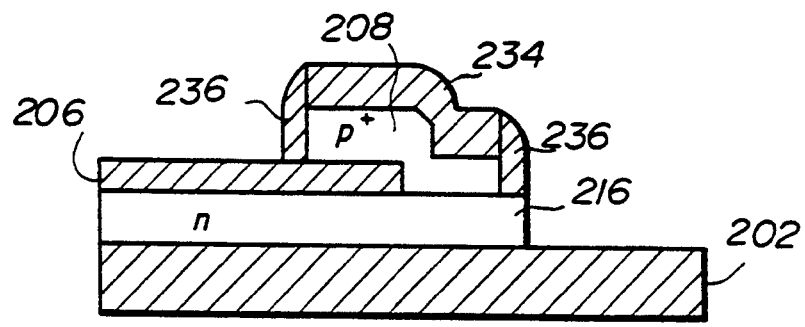

As shown in FIG. 16B, an oxide film is deposited on the entire surface, and then the oxide sidewall 236 is formed along the side surface of the base lead electrode 208 by the etch-back process. As shown in FIG. 16C, the n-type silicon layer 204 is etched by using the oxide film 234 and the sidewall 236 as a mask.

Figure 16D:
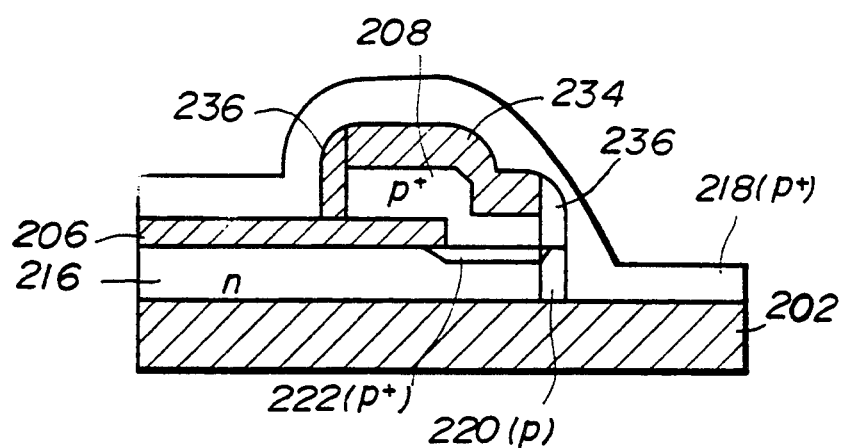

Thereafter, as shown in FIG. 16D, the BSG film 218 is coated on the entire surface, and a heat treatment process is carried out. During the heat treatment process, the impurity in the BSG film 18 is diffused into the side surface of the n-type contact layer 216, so the p-type base region 220 is formed. Simultaneously, the impurity in the p+-type base lead electrode 208 is diffused into the surface of the n-type contact layer 216, so the p+-type base lead region 222 is formed. Then, the p-type base region 220 and the p+-type base lead region 222 are linked to each other.

Figure 16E:
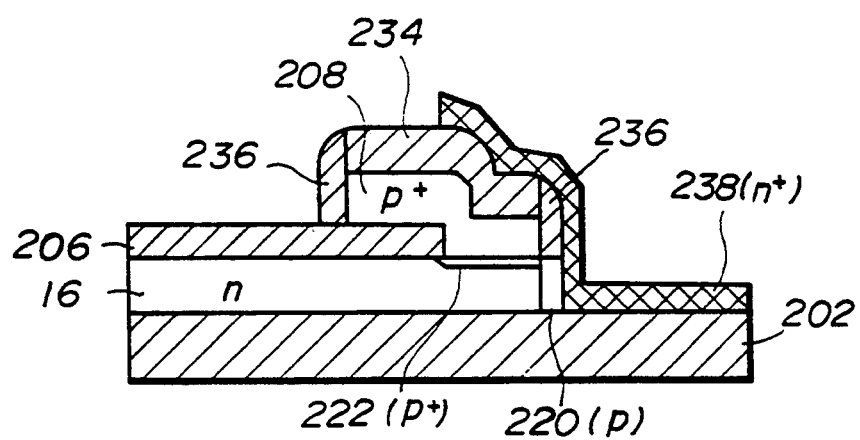
Figure 16F:
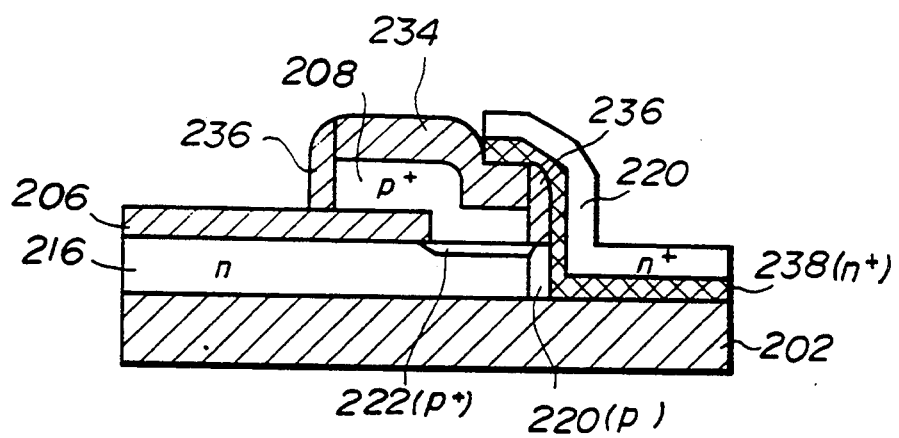

As shown in FIG. 16E, the BSG film 218 is removed, and an SiC layer is deposited on the entire surface while an n-type impurity is introduced in the SIC layer. The SiC layer is then patterned into a predetermined shape, so that the n+-type SiC emitter region 238 in contact with the side surface of the p-type base region 220 is formed on the insulating substrate 202. As shown in FIG. 16F, a polysilicon layer is deposited on the entire surface while an n-type impurity is introduced therein, and is then patterned into a predetermined shape. In this manner, the n+-type emitter lead electrode 224 is formed on the n+-type SiC emitter region 238.

Figure 15A:
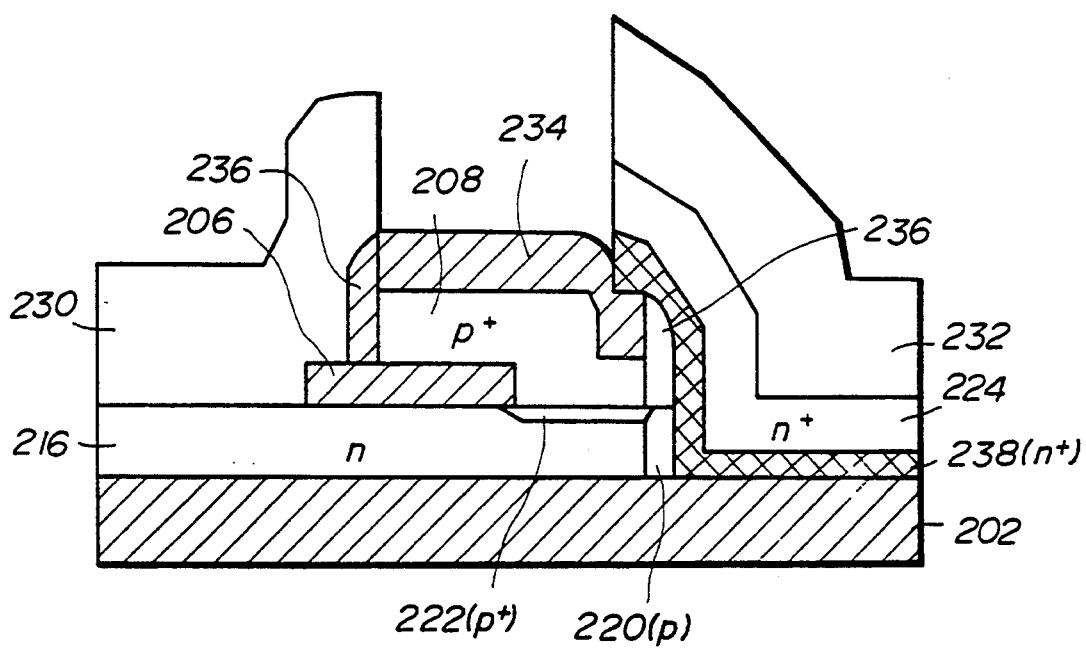
FIG. 15A is a cross-sectional view of a lateral bipolar transistor according to a sixth embodiment of the present invention.
Figure 16G:
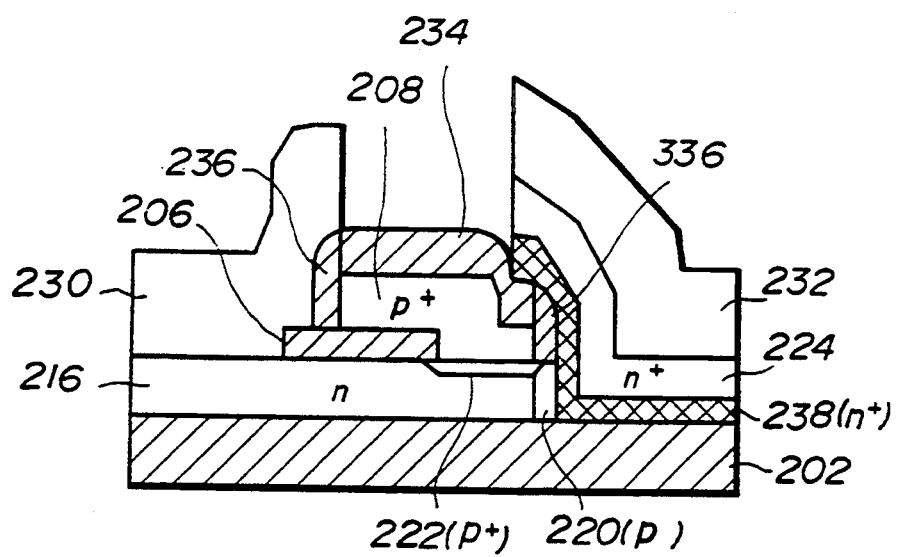

Then, as shown in FIG. 16G, the thermal oxidization film 206 is removed by an etching process in which a resist having a predetermined shape is used as a mask. Thereafter, the metallic contact electrode 230 is formed on the n-type contact layer 216, and the metallic emitter electrode 232 is formed on the n+-type emitter lead electrode 224. In the above-mentioned process, the lateral bipolar transistor shown in FIG. 15A is fabricated.

According to the sixth embodiment of the present invention, the n+-type SiC emitter region 38 having a band gap wider than that of silicon is formed so that it is in contact with the side surface of the p-type base region 220. Hence, it is possible to realize an HBT having a wide-band-gap-emitter structure in the lateral bipolar transistor structure. With this structure, it becomes possible to prevent a minority carrier from being poured into the emitter from the base and hence improve the emitter injection efficiency.

FIG. 15B is an energy band diagram of the lateral bipolar transistor shown in FIG. 15A.

A description will now be given of a seventh embodiment of the present invention with reference to FIGS. 17A and 17B. A lateral bipolar transistor of the seventh embodiment of the present invention includes an insulating substrate 301, an insulating layer 302, and an active layer 306. In the active layer 306, there are formed an emitter region 306E, a base region 306B, a collector region 306C, and a sub-collector region 306S. The emitter region 306E is located at a center portion of the n-type active layer 306. The p-type base region 306B has an approximately ring shape (a closed loop structure) and is formed so that it surrounds the emitter region 306E in the horizontal direction. A portion of the n-type active layer 306 surrounded by the base region 306B is the collector region 306C. The collector region 306 having a high impurity concentration is formed so that it surrounds the collector region 306C in the horizontal direction. The structure of the base region 306B makes it possible to pass a larger amount of current and improve the high-frequency characteristic.

In the circumference of the emitter region, the base region 306B and the collector region 306C are arranged. In this structure, it is necessary for the base region 306B to have a depth which penetrates the active layer 306. In the structure shown in FIGS.17A and 17B, the emitter region 306E is formed so that it penetrates the active region 306. However, in principle, there is no problem even if a part of the base region 306B remains under the emitter region 306E.

A base lead electrode 307 is formed, through an interlayer insulating layer 308, on the active layer 306 so that it is connected to the base region 306B. An interlayer insulating layer 310 is formed on the base lead electrode 307. An emitter electrode 309 connected to the emitter region 306E is formed on the interlayer insulating layer 310. A collector electrode 311 which is connected to the sub-collector region 306S.

Figure 17A:
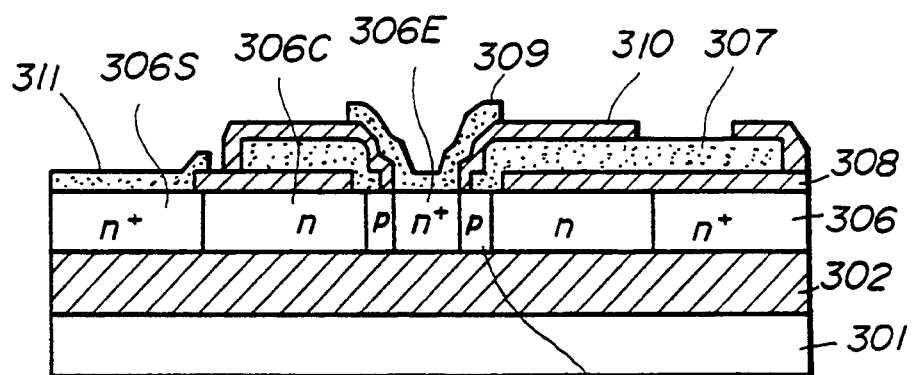
FIG. 17A is a cross-sectional view of a lateral bipolar transistor according to a seventh embodiment of the present invention.
Figure 17B:
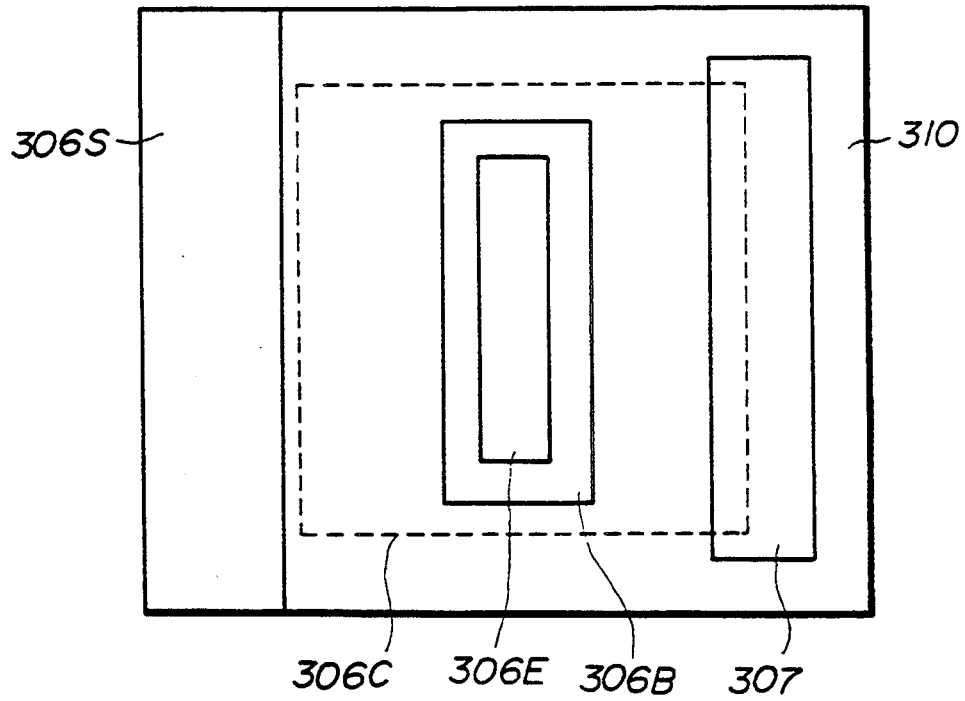
FIG. 17B is a plan view of the lateral bipolar transistor shown in FIG. 17A.

The structure shown in FIGS. 17A and 17B is capable of passing an amount of current approximately equal to that for the prior art nevertheless the structure shown in FIGS. 17A and 17B has an occupied area on the substrate 301 which is narrower than that for the prior art. In other words, according to the present invention, the integration density can be increased while the almost same current capacity as that for the prior art can be maintained. Further, the base electrode 306B has a small resistance, and hence there is a margin enough for a voltage drop developed across the base.

Figure 18:
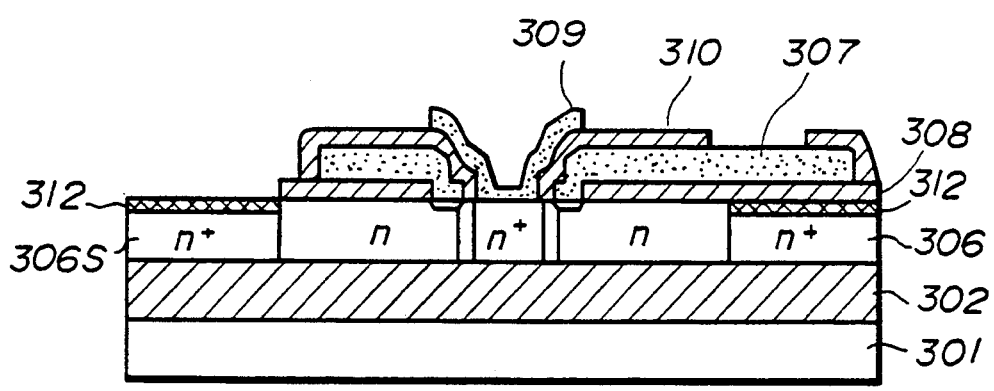
FIG. 18 is a cross-sectional view of a first variation of the transistor shown in FIGS. 17A and 17B.

FIG. 18 is a cross-sectional view of a first variation of the structure shown in FIG. 17. In FIG. 18, parts which are the same as those shown in FIG. 17 are given the same reference numerals. The first variation shown in FIG. 18 is intended to decrease the collector resistance. For this purpose, a surface portion of the active layer 306 in the sub-collector region 306S is selectively changed to a silicide layer 312. This can be done by selectively forming a refractory metal or its silicide on the sub-collector region 306S.

Figure 19:
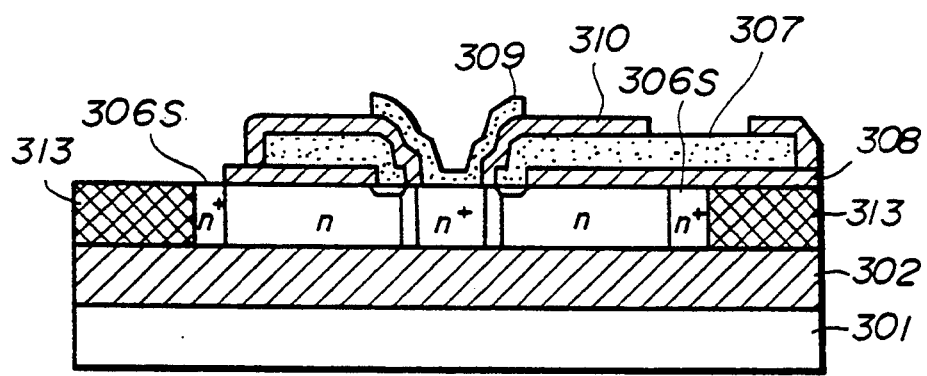
FIG. 19 is a cross-sectional view of a second variation of the transistor shown in FIGS. 17A and 17B.

FIG. 19 is a cross-sectional view of a second variation of the structure shown in FIG. 17. In FIG. 19, those parts which are the same as those shown in FIG. 17 are given the same reference numerals. The second variation shown in FIG. 19 is intended to reduce the collector resistance as in the case of the structure shown in FIG. 18. A part of the sub-collector region 306S is changed to a silicide layer 313 along the entire thickness thereof. The silicide layer 313 can be formed by selectively growing tungsten (W) from the exposed surface of the sub-collector region 306S.

Figure 20:
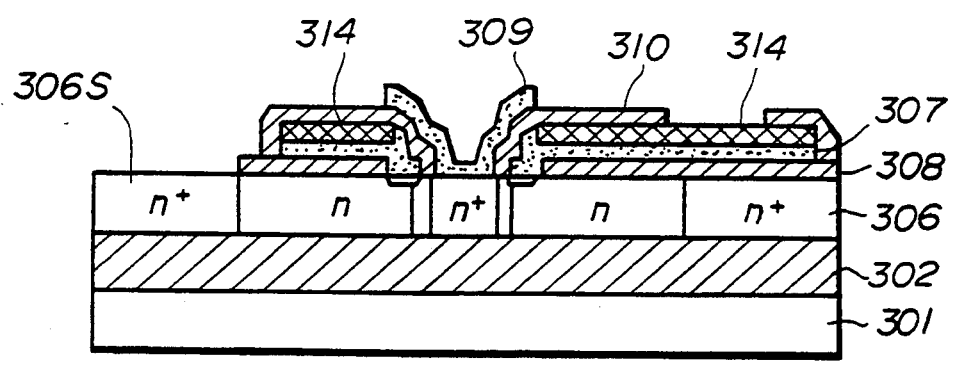
FIG. 20 is a cross-sectional view of a third variation of the transistor shown in FIGS. 17A and 17B.

FIG. 20 is a cross-sectional view of a third variation of the structure shown in FIG. 17. In FIG. 20, parts which are the same as those shown in FIG. 17 are given the same reference numerals. The second variation shown in FIG. 20 is intended to decrease the base resistance. For this purpose, a surface portion of the base lead electrode 307 is changed to a silicide layer 314. This silicide layer can be formed by depositing a refractory metal or its silicide on the polysilicon layer used for forming the base lead electrode 307 and patterning it using the same mask.

Figures 21A, 21B:
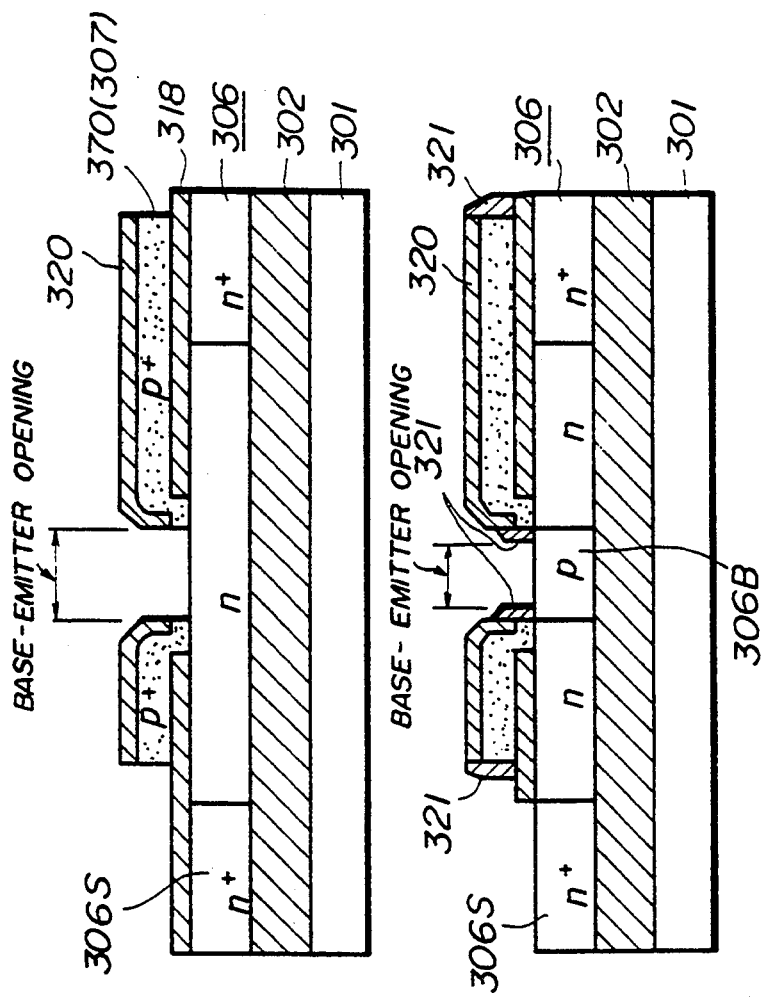
FIGS. 21a through 21D are cross-sectional views showing a process of producing the lateral bipolar transistor shown in FIGS. 17A and 17B.

FIGS. 21A through 21D show a process of producing the structure shown in FIGS. 17A and 17B. As shown in FIG. 21A, the SOI substrate is prepared which is composed of the substrate 301, such as a silicon wafer, and the n-type silicon single crystal active layer 306 formed on the insulating layer 302 on the substrate 301. The active layer 306 is, for example, 0.3μm thick, the resistivity thereof is 0.1 Ω-cm.

The insulating layer 318 made of SiO$_2$ is formed to about 0.1 μm on the active layer 306. The insulating layer 318 can be formed by the known thermal oxidization process or CVD process. Next, an n-type impurity is implanted, via the insulating layer 318, into a predetermined region in the active layer 306, so that the sub-collector region 306S is formed. The ion implantation is carried out under a condition such that the n-type impurity is As, the acceleration energy is 300 keV, and the dose of the n-type impurity is $1 \times 10^{16}$ atoms/cm$^3$.

By the conventional photolithographic process, the insulating layer 318 is selectively etched, so an opening slightly greater than the base region 306B is formed. The active layer 306 is exposed through the opening formed in the insulating layer 318. A polysilicon layer 370 doped with B atoms is deposited on the surface of the substrate. An insulating layer 320 made of, for example, SiO$_2$, is deposited on the polysilicon layer 370.

By the conventional photolithographic process, the insulating layer 320 and the polysilicon layer 370 are sequentially etched so that a base-emitter opening is formed therein. In this patterning process, the polysilicon layer 3270 is patterned into the shape of the base lead electrode 307. The base lead electrode 307 is in contact with the active layer 306 through the opening formed in the insulating layer 318.

In the patterning process of the polysilicon layer 370, it is preferable that a dry etching process be used in the final stage of etching in order to prevent the active layer 306 exposed through the base-emitter opening from being damaged. It is possible to remove the insulating layer 318 after the ion implantation for forming the sub-collector region 306S is completed and deposit, on the active layer 306, another insulating layer which corresponds to the insulating layer 318.

As shown in FIG. 21B, an insulating sidewall layer 321 is formed along the side surface of the base lead electrode 307. For example, an SiO$_2$ insulating layer is deposited to 0.3 μm on the substrate surface, and patterned by an anisotropic etching, such as the RIE etching process. After this, the p-type impurity is implanted via the base-emitter opening by using the insulating sidewall layer 321 and the base lead electrode 307 as a mask. For example, a dose of B ions equal to $3 \times 10^{13}$ atoms/cm$^3$ is implanted at an acceleration energy of 50 keV. By this ion implantation, the conductivity of the active layer 306 exposed via the base-emitter opening is changed to the p-type. Where necessary, a thermal process for diffusing the p-type impurity atoms under the insulating sidewall layer 321. It is also possible to implant the p-type impurity in the base region before the insulating sidewall layer 321 is formed and then form the insulating sidewall layer 321. Even when the insulating sidewall layer 321 is formed by the RIE process, the region in which the base will be finally formed is not affected by the impurity ions because the above region is covered by the insulating sidewall layer 321.

As shown in FIG. 21, the n-type impurity ions are implanted into the base region, so that the emitter region 306E is formed. For example, As or P ions are implanted at a dose of $1 \times 10^{16}$ atoms/cm$^3$ and an acceleration energy of 400 keV. In this manner, the p-type base region 306B having the substantially constant thickness remains so that it surrounded by the emitter region 306E. For the above value of the acceleration energy, the n-type impurity reaches the bottom of the active layer 306, so that the emitter layer 306E comes into contact with the insulating layer 302. If the ion implantation is carried out at a reduced acceleration energy, the emitter region 306E is formed so that the p-type base region 306B remains at the bottom of the emitter region 306E. The bipolar transistor having a structure as described above can operate as a lateral bipolar transistor.

Figures 21C, 21D:
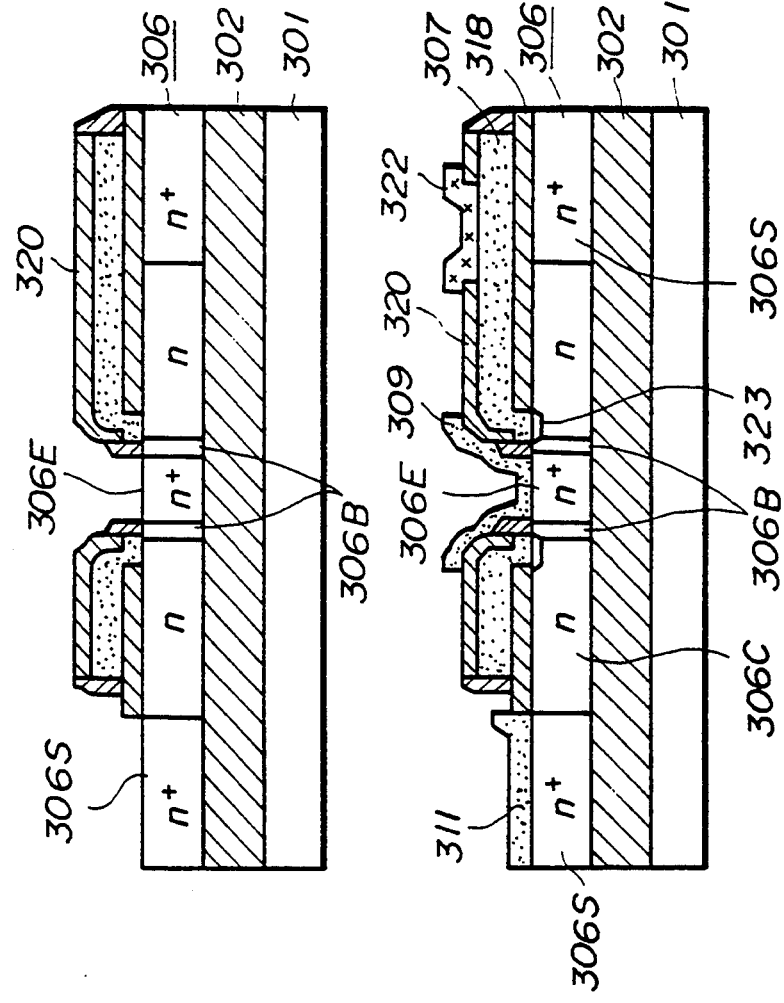

After this, as shown in FIG. 21D, a polysilicon layer doped with an n-type impurity is deposited on the substrate surface, and patterned. In this manner, the emitter electrode 309 connected to the emitter region 306E and the collector electrode 311 connected to the sub-collector region 306S are formed. An opening is formed in the insulating layer 320 so that the base lead electrode 307 is exposed via the opening. Thereafter, a base electrode 322 connected to the base lead electrode 307 via the opening is formed.

An ion implantation process for forming the base region 306B and ion implantation for forming the emitter region 306E are carried out. After this, an annealing process necessary for making the implanted impurity atoms active is carried out. The p-type impurity contained in the base lead electrode 307 is diffused in the active layer 306 by this annealing process, so that a high-concentration region 323 is formed. Thereby, a connection between the base region 306B and the base lead electrode 307 is made sure, and has a reduced resistance.

It is possible to change, to a silicide layer, part of the active layer 306 in the sub-collector region 306S or part of the surface of the polysilicon layer 370 forming the base lead electrode 307.

All the embodiments described above are the npn-type lateral bipolar transistors. However, by interchanging the conductivity of each conductive layer with each other, pnp-type lateral bipolar transistors can be fabricated. It is also possible to fabricated on the common SOI substrate together with the lateral bipolar transistors, other types of transistors, such as MOSFETs or CMOS transistors.

The present invention is not limited to the specifically disclosed embodiments, and variations and modifications may be made without departing from the scope of the present invention.

What is claimed is:

1. A lateral bipolar transistor comprising:
   an insulating substrate;
   a single crystal semiconductor layer having a first conductivity;
   a mask layer which has a conductive layer having a substantially vertical side surface;
   an insulating sidewall formed along said surface of said conductive layer of mask layer;
   a base region located under said insulating sidewall and formed in said single crystal semiconductor layer, said base region having a second conductivity opposite to said first conductivity and containing an impurity implanted by an ion implantation process, said single crystal semiconductor layer having an underlying portion on which said mask layer and said insulating sidewall are formed, said underlying portion of said single crystal semiconductor layer being connected to said base region and being formed in a surface portion of said single crystal semiconductor layer;
   an emitter region formed in a first portion of said single crystal semiconductor layer other than said underlying portion; and
   a collector region formed in a second portion of said crystal semiconductor layer other than said underlying portion,
   said base region having a width dependent on a width of said insulating sidewall,
   said conductive layer of said mask layer being in a contact with said underlying portion of said single crystal semiconductor layer so that said underlying portion of said single crystal semiconductor layer forms a base lead between said base region and said conductive layer of said mask layer,
   an interface between said emitter region and said base region being substantially defined by an end portion of said insulating sidewall, and
   another interface between said collector region and said base region depending on a position of said vertical side surface of said conductive layer of said mask layer.

2. A lateral bipolar transistor as claimed in claim 1, wherein said conductive layer of said mask layer comprises a polycrystal semiconductor layer which is in contact with said underlying portion of the single crystal semiconductor layer and which has the second conductivity.

3. A lateral bipolar transistor as claimed in claim 1, wherein said width of base region is approximately equal to said width of said insulating sidewall.

4. A lateral bipolar transistor as claimed in claim 1, wherein:
   said conductive layer of said mask layer comprises a polycrystal semiconductor layer which is in contact with said underlying portion of the single crystal semiconductor layer and which has the second conductivity; and
   said underlying portion of said single crystal semiconductor layer being in contact with said polycrystal semiconductor layer and said base region.

5. A lateral bipolar transistor as claimed in claim 1, wherein said end portion of said insulating sidewall has a substantially vertical surface which defines said interface between said base region and said emitter region.

6. A lateral bipolar transistor comprising:
   an insulating substrate;
   a single crystal semiconductor layer which is formed on said insulating substrate and which has a first substantially vertical side surface, said single crystal semiconductor layer having a first conductivity;
   a mask layer which has a conductive layer having a second substantially vertical side surface;
   an insulating sidewall formed along said second substantially vertical side surface;
   an emitter region which is formed in said single crystal semiconductor layer and which has said first substantially vertical side surface, said emitter region having the first conductivity;
   a base region which is formed in said single crystal semiconductor layer and located adjacent to said emitter region, said base region having a second conductivity opposite to said first conductivity, said single crystal semiconductor layer having an underlying portion on which said mask layer and said insulating sidewall are formed, said underlying portion of said single crystal semiconductor layer being connected to said base region and being formed in a surface portion of said single crystal semiconductor layer; and
   a collector region which is a portion of said single crystal semiconductor layer other than said emitter region and said base region,
   said conductive layer of said mask layer being in contact with said underlying portion of said single crystal semiconductor layer so that said underlying portion of said single crystal semiconductor layer forms a base lead between said base region and said conductive layer of said mask layer, and
   an interface between said emitter region and said base region being offset from an end portion of said insulating sidewall.

7. A lateral bipolar transistor as claimed in claim 6, wherein:
   said conductive layer of said mask comprises a polycrystal semiconductor layer which is in contact with said underlying portion of said single crystal semiconductor layer; and
   said underlying layer of said single crystal semiconductor layer being in contact with said polycrystal semiconductor layer and said base region.

8. A lateral bipolar transistor as claimed in claim 6, wherein said lateral bipolar transistor further comprises:
   a first polycrystal semiconductor layer which is formed on said insulating substrate and which is in contact with said emitter region; and
   a second polycrystal semiconductor layer which is formed on said single crystal semiconductor layer and which is in contact with said collector region.

9. A lateral bipolar transistor as claimed in claim 6, wherein said base region is located in a portion of said single crystal semiconductor layer in a vicinity of said second substantially vertical side surface.

10. A lateral bipolar transistor as claimed in claim 6, wherein:
    said single crystal semiconductor layer has a collector ohmic region formed in a side surface of said single crystal semiconductor layer opposite to said first substantially vertical side surface.

11. A lateral bipolar transistor as claimed in claim 6, wherein said lateral bipolar transistor further comprises:
    an emitter lead layer which is formed on said insulating substrate and which is in contact with said emitter region;
    an emitter electrode formed on said emitter lead layer;
    a collector lead electrode which is formed on said single crystal semiconductor layer and which is in contact with said collector region; and
    a collector electrode formed on said collector lead electrode.

12. A lateral bipolar transistor as claimed in claim 6, wherein said emitter region has a band gap wider than that of said base region.

13. A lateral bipolar transistor as claimed in claim 12, wherein said emitter region comprises silicon carbide, and said base region comprises silicon.

14. A lateral bipolar transistor as claimed in claim 1, wherein said base region has a ring shape and surrounds said emitter region in a horizontal direction.

15. A lateral bipolar transistor as claimed claim 6, wherein:
    said base region contains an impurity diffused from said first substantially vertical side surface; and
    said emitter region contains an impurity diffused from said first substantially vertical side surface.

16. A lateral bipolar transistor comprising:
    an insulating substrate having a substantially cross shape having first, second, third and fourth branch portions, said first and second branch portions facing each other, and said third and fourth branch portions facing each other;
    a single crystal semiconductor layer having a first conductivity;
    a mask layer which has a substantially vertical side surface;
    an insulating sidewall formed along said conductive layer of the mask layer;
    a base region located under said insulating sidewall and formed in said first and second facing branch portions, said base region having a second conductivity opposite to said first conductivity and having an impurity implanted by an ion implantation process;
    an emitter region formed in said third branch portion; and
    a collector region formed in said fourth branch portions, said emitter region having side surfaces which are in contact with said base region, said base region having side surfaces which are in contact with said collector region and having a width dependent on a width of said insulating sidewall,
    an interface between said emitter region and said base region being substantially defined by an end portion of said insulating sidewall, and
    another interface between said collector region and said base region depending on a position of said vertical said surface of said conductive layer of said mask layer.

* * * * *

UNITED STATES PATENT AND TRADEMARK OFFICE
CERTIFICATE OF CORRECTION

PATENT NO. : 5,376,823

DATED : December 27, 1994

INVENTOR(S) : Manabu KOJIMA et al.

It is certified that error appears in the above-indentified patent and that said Letters Patent is hereby corrected as shown below:

Col. 1, line 60, delete "an".

Col. 2, line 6, change "Opening" to --Openings--; and
line 34, after "invention" insert --is--.

Col. 4, line 9, change "21a" to --21A--;

Col. 5, line 64, change "that" to --than--.

Col. 7, line 10, delete "VII-"; and
line 11, change "$_D$-VII$_D$" to --VII$_D$-VII$_D$--.

Col. 8, line 45, after "layer" insert --112--.

Col. 11, line 15, change "n$^{30}$" to --n$^+$--; and
line 18, change "p$^{30}$" to --p$^+$--.

Col. 12, line 57, change "control" to --controlling--.

Col. 13, line 31, change "p$^{30}$" to --p$^+$--.

Col. 14, line 39, change "FIGS.-" to --FIGS.--.

UNITED STATES PATENT AND TRADEMARK OFFICE
CERTIFICATE OF CORRECTION

PATENT NO. : 5,376,823
DATED : December 27, 1994
INVENTOR(S) : Manabu KOJIMA et al.

It is certified that error appears in the above-indentified patent and that said Letters Patent is hereby corrected as shown below:

<u>Col. 15</u>, line 5, delete "which"; and line 9, after "art" insert --,--.

<u>Col. 16</u>, line 39, after "process" insert --is used--; and line 54, after "that it" insert --is--.

<u>Col. 17</u>, line 26, change "fabricated" (second occurrence) to --fabricate--;

line 42, before "mask" insert --the--; and line 63, delete "a".

<u>Col. 18</u>, line 15, before "base" insert --said--.

<u>Col. 20</u>, line 7, after "claimed" insert --in--;

line 21, after "has" insert --a conductive layer having--;

line 23, after "said" insert --side surface of said--; and

UNITED STATES PATENT AND TRADEMARK OFFICE
CERTIFICATE OF CORRECTION

PATENT NO. : 5,376,823
DATED : December 27, 1994
INVENTOR(S) : Manabu Kojima, et al Page 3 of 3

It is certified that error appears in the above-indentified patent and that said Letters Patent is hereby corrected as shown below:

Col. 20, line 45, change "said" (first occurrence) to --side--.

Signed and Sealed this

Sixth Day of June, 1995

BRUCE LEHMAN

Attest:

Attesting Officer

Commissioner of Patents and Trademarks